US008611550B2

(12) United States Patent
Del Galdo et al.

(10) Patent No.: US 8,611,550 B2
(45) Date of Patent: Dec. 17, 2013

(54) APPARATUS FOR DETERMINING A CONVERTED SPATIAL AUDIO SIGNAL

(75) Inventors: Giovanni Del Galdo, Heroldsberg (DE); Fabian Kuech, Erlangen (DE); Markus Kallinger, Erlangen (DE); Ville Pulkki, Espoo (FI); Mikko-Ville Laitinen, Espoo (FI); Richard Schultz-Amling, Nuremberg (DE)

(73) Assignee: Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 495 days.

(21) Appl. No.: 13/026,012

(22) Filed: Feb. 11, 2011

(65) Prior Publication Data

US 2011/0222694 A1 Sep. 15, 2011

Related U.S. Application Data

(63) Continuation of application No. PCT/EP2009/005859, filed on Aug. 12, 2009.

(60) Provisional application No. 61/088,513, filed on Aug. 13, 2008, provisional application No. 61/091,682, filed on Aug. 25, 2008.

(30) Foreign Application Priority Data

Feb. 2, 2009 (EP) .................................... 09001398

(51) Int. Cl.
*H03G 3/00* (2006.01)
*H04R 5/00* (2006.01)

(52) U.S. Cl.
USPC .................................. 381/61; 381/63; 381/17

(58) Field of Classification Search
USPC ........................ 381/61, 63, 92, 23, 17, 18, 19
See application file for complete search history.

(56) References Cited

U.S. PATENT DOCUMENTS 5,812,674 A 9/1998 Jot et al.

(Continued)

FOREIGN PATENT DOCUMENTS

JP 2003274492 9/2003

(Continued)

OTHER PUBLICATIONS

Ahonen, J. et al.; "Teleconference application and B-format microphone array for Directional Audio Coding"; Mar. 15-17, 2007; AES 30th Int'l Conference, 10 pages; Saariselka, Finland.

(Continued)

*Primary Examiner* — Vivian Chin
*Assistant Examiner* — David Ton
(74) *Attorney, Agent, or Firm* — Michael A. Glenn; Perkins Coie LLP

(57) ABSTRACT

An apparatus for determining a converted spatial audio signal, the converted spatial audio signal having an omnidirectional audio component and at least one directional audio component, from an input spatial audio signal, the input spatial audio signal having an input audio representation and an input direction of arrival. The apparatus has an estimator for estimating a wave representation having a wave field measure and a wave direction of arrival measure based on the input audio representation and the input direction of arrival. The apparatus further has a processor for processing the wave field measure and the wave direction of arrival measure to obtain the omnidirectional audio component and the at least one directional component.

16 Claims, 11 Drawing Sheets

(56) References Cited

U.S. PATENT DOCUMENTS

| | | | | |
|---|---|---|---|---|
| 6,259,795 | B1 | 7/2001 | McGrath | |
| 7,231,054 | B1 * | 6/2007 | Jot et al. | 381/310 |
| 7,706,543 | B2 | 4/2010 | Daniel | |
| 8,103,006 | B2 * | 1/2012 | McGrath | 381/20 |
| 8,284,952 | B2 * | 10/2012 | Reining et al. | 381/92 |
| 2006/0045275 | A1 | 3/2006 | Daniel | |
| 2008/0004729 | A1 * | 1/2008 | Hiipakka | 700/94 |
| 2008/0232601 | A1 | 9/2008 | Pulkki | |

FOREIGN PATENT DOCUMENTS

| | | |
|---|---|---|
| JP | 2003531555 | 10/2003 |
| JP | 2005-345979 | 12/2005 |
| JP | 2006506918 | 2/2006 |
| JP | 2007-124023 | 5/2007 |
| JP | 2010-521909 | 6/2010 |
| WO | WO-0182651 | 11/2001 |
| WO | WO 2004/077884 A1 | 9/2004 |
| WO | WO-2008113427 | 9/2008 |

OTHER PUBLICATIONS

The Int'l Search Report and Written Opinion, mailed Nov. 17, 2009, in related PCT patent application No. PCT/EP2009/005859, 17 pages.

Engdegard, J. et al.; "Spatial Audio Object Coding (SAOC)—The Upcoming MPEG Standard on Parametric Object Based Audio Coding"; May 17-20, 2008; 124th AES Convention, 15 pages; Amsterdam, The Netherlands.

Fahy, F.J.; "Sound Intensity"; 1989, Essex: Elsevier Science Publisher Ltd., pp. 38-88.

Foss, R. et al.; "A Distributed System for the Creation and Delivery of Ambisonic Surround Sound Audio"; Jan. 1, 1999; Proceedings of the Int;l AES Conference; pp. 116-125, XP002409673.

Gerzon, Michael; "Surround-sound psychoacoustics"; Dec. 1974; *Wireless World*; 6 pages.

Merimaa, Juha; "Applications of a 3-D Microphone Array"; May 10-13, 2002; AES 112th Convention, 11 pages; Munich, Germany.

Pope, J. et al.; "Realtime Room Acoustics Using Ambisonics"; Mar. 1999; AES 16th Int'l Conference, pp. 427-435, XP002526347.

Pulkki, V. et al.; "Directional Audio Coding: Filterbank and STFT-based Design"; May 20-23, 2006, AES 120th Convention, 12 pages; Paris, France.

Pulkki, V.; "Directional audio coding in spatial sound reproduction and stereo upmixing"; Jun. 30-Jul. 2, 2006; AES 28th Int'l Conference, 8 pages; Pitea, Sweden.

Pulkki, V.; "Spatial Sound Reproduction with Directional Audio Coding"; Jun. 2007; Journal of Audio Engineering Society, vol. 55, No. 6, p. 506, figure 3.

Villemoes, L. et al.; "MPEG Surround: The Forthcoming ISO Standard for Spatial Audio Coding"; Jun. 30-Jul. 2, 2006; AES 28th Int'l Conference, 18 pages; Pitea, Sweden.

Pulkki, V, "Spatial Sound Reproduction with Directional Audio Coding", Journal of the AES. vol. 55, No. 6. New York, NY, USA., Jun. 1, 2007, 503-516.

* cited by examiner

APPARATUS FOR DETERMINING A CONVERTED SPATIAL AUDIO SIGNAL

CROSS-REFERENCE TO RELATED APPLICATIONS

This application is a continuation of copending International Application No. PCT/EP2009/005859, filed on Aug. 12, 2009, which is incorporated herein by reference in its entirety, and additionally claims priority from U.S. Provisional Application No. 61/088,513, filed Aug. 13, 2008, U.S. Provisional Application No. 61/091,682, filed Aug. 25, 2008, and European Application No. 09001398.8, filed Feb. 2, 2009, which are all incorporated herein by reference in their entirety.

BACKGROUND OF THE INVENTION

The present invention is in the field of audio processing, especially spatial audio processing and conversion of different spatial audio formats.

DirAC audio coding (DirAC=Directional Audio Coding) is a method for reproduction and processing of spatial audio. Conventional systems apply DirAC in two dimensional and three dimensional high quality reproduction of recorded sound, teleconferencing applications, directional microphones, and stereo-to-surround upmixing, cf.

V. Pulkki and C. Faller, Directional audio coding: Filterbank and STFT-based design, in 120$^{th}$ AES Convention, May 20-23, 2006, Paris, France May 2006, V. Pulkki and C. Faller, Directional audio coding in spatial sound reproduction and stereo upmixing, in AES 28$^{th}$ International Conference, Pitea, Sweden, June 2006, V. Pulkki, Spatial sound reproduction with directional audio coding, Journal of the Audio Engineering Society, 55(6): 503-516, June 2007, Jukka Ahonen, V. Pulkki and Tapio Lokki, Teleconference application and B-format microphone array for directional audio coding, in 30$^{th}$ AES International Conference.

Other conventional applications using DirAC are, for example, the universal coding format and noise canceling. In DirAC, some directional properties of sound are analyzed in frequency bands depending on time. The analysis data is transmitted together with audio data and synthesized for different purposes. The analysis is commonly done using B-format signals, although theoretically DirAC is not limited to this format. B-format, cf. Michael Gerzon, Surround sound psychoacoustics, in Wireless World, volume 80, pages 483-486, December 1974, was developed within the work on Ambisonics, a system developed by British researchers in the 70's to bring the surround sound of concert halls into living rooms. B-format consists of four signals, namely w(t),x(t),y(t), and z(t). The first corresponds to the pressure measured by an omnidirectional microphone, whereas the latter three are pressure readings of microphones having figure-of-eight pickup patterns directed towards the three axes of a Cartesian coordinate system. The signals x(t),y(t) and z(t) are proportional to the components of particle velocity vector directed towards x,y and z respectively.

The DirAC stream consists of 1-4 channels of audio with directional metadata. In teleconferencing and in some other cases, the stream consists of only a single audio channel with metadata, called a mono DirAC stream. This is a very compact way of describing spatial audio, as only a single audio channel needs to be transmitted together with side information, which e.g., gives good spatial separation between talkers. However, in such cases some sound types, such as reverberated or ambient sound scenarios may be reproduced with limited quality. To yield better quality in these cases, additional audio channels need to be transmitted.

The conversion from B-format to DirAC is described in V. Pulkki, A method for reproducing natural or modified spatial impression in multichannel listening, Patent WO 2004/077884 A1, September 2004. Directional Audio Coding is an efficient approach to the analysis and reproduction of spatial sound. DirAC uses a parametric representation of sound fields based on the features which are relevant for the perception of spatial sound, namely the DOA (DOA=direction of arrival) and diffuseness of the sound field in frequency subbands. In fact, DirAC assumes that interaural time differences (ITD) and interaural level differences (ILD) are perceived correctly when the DOA of a sound field is correctly reproduced, while interaural coherence (IC) is perceived correctly, if the diffuseness is reproduced accurately. These parameters, namely DOA and diffuseness, represent side information which accompanies a mono signal in what is referred to as mono DirAC stream.

FIG. 7 shows the DirAC encoder, which from proper microphone signals computes a mono audio channel and side information, namely diffuseness $\Psi(k,n)$ and direction of arrival $e_{DOA}(k,n)$. FIG. 7 shows a DirAC encoder 200, which is adapted for computing a mono audio channel and side information from proper microphone signals. In other words, FIG. 7 illustrates a DirAC encoder 200 for determining diffuseness and direction of arrival from proper microphone signals. FIG. 7 shows a DirAC encoder 200 comprising a P/U estimation unit 210, where P(k,n) represents a pressure signal and U(k,n) represents a particle velocity vector. The P/U estimation unit receives the microphone signals as input information, on which the P/U estimation is based. An energetic analysis stage 220 enables estimation of the direction of arrival and the diffuseness parameter of the mono DirAC stream.

The DirAC parameters, as e.g. a mono audio representation W(k,n), a diffuseness parameter $\Psi(k,n)$ and a direction of arrival (DOA) $e_{DOA}(k,n)$, can be obtained from a frequency-time representation of the microphone signals. Therefore, the parameters are dependent on time and on frequency. At the reproduction side, this information allows for an accurate spatial rendering. To recreate the spatial sound at a desired listening position a multi-loudspeaker setup is required. However, its geometry can be arbitrary. In fact, the loudspeakers channels can be determined as a function of the DirAC parameters.

There are substantial differences between DirAC and parametric multichannel audio coding, such as MPEG Surround, cf. Lars Villemoes, Juergen Herre, Jeroen Breebaart, Gerard Hotho, Sascha Disch, Heiko Purnhagen, and Kristofer Kjrling, MPEG surround: The forthcoming ISO standard for spatial audio coding, in AES 28$^{th}$ International Conference, Pitea, Sweden, June 2006, although they share similar processing structures. While MPEG Surround is based an a time/frequency analysis of the different, loudspeaker channels, DirAC takes as input the channels of coincident microphones, which effectively describe the sound field in one point. Thus, DirAC also represents an efficient recording technique for spatial audio.

Another system which deals with spatial audio is SAOC (SAOC=Spatial Audio Object Coding), cf. Jonas Engdegard, Barbara Resch, Cornelia Falch, Oliver Hellmuth, Johannes Hilpert, Andreas Hoelzer, Leonid Terentiev, Jeroen Breebaart, Jeroen Koppens, Erik Schuijers, and Werner Oomen, Spatial audio object (SAOC) the upcoming MPEG standard on parametric object based audio coding, in 12$^{th}$ AES Convention, May 17-20, 2008, Amsterdam, The Netherlands, 2008, currently under standardization ISO/MPEG. It builds upon the rendering engine of MPEG Surround and treats different sound sources as objects. This audio coding offers very high efficiency in terms of bitrate and gives unprecedented freedom of interaction at the reproduction side. This approach promises new compelling features and functionality in legacy systems, as well as several other novel applications.

SUMMARY

According to an embodiment, an apparatus adapted to determine a combined converted spatial audio signal, the combined converted spatial audio signal having at least a first combined component and a second combined component, from a first and a second input spatial audio signal, the first input spatial audio signal having a first input audio representation and a first direction of arrival, the second spatial input signal having a second input audio representation and a second direction of arrival, may have: a first means adapted to determine a first converted signal, the first converted signal having a first omnidirectional component and at least one first directional component, from the first input spatial audio signal, the first means having an estimator adapted to estimate a first wave representation, the first wave representation having a first wave field measure and a first wave direction of arrival measure, based on the first input audio representation and the first input direction of arrival; and a processor adapted to process the first wave field measure and the first wave direction of arrival measure to obtain the first omnidirectional component and the at least one first directional component; wherein the first means is adapted to provide the first converted signal having the first omnidirectional component and the at least one first directional component; a second means adapted to provide a second converted signal based on the second input spatial audio signal, having a second omnidirectional component and at least one second directional component, the second means having an other estimator adapted to estimate a second wave representation, the second wave representation having a second wave field measure and a second wave direction of arrival measure, based on the second input audio representation and the second input direction of arrival; and an other processor adapted to process the second wave field measure and the second wave direction of arrival measure to obtain the second omnidirectional component and the at least one second directional component; wherein the second means is adapted to provide the second converted signal having the second omnidirectional component and at least one second directional component; an audio effect generator adapted to render the first omnidirectional component to obtain a first rendered component or to render the first directional component to obtain the first rendered component; a first combiner adapted to combine the first rendered component, the first omnidirectional component and the second omnidirectional component, or to combine the first rendered component, the first directional component, and the second directional component to obtain the first combined component; and a second combiner adapted to combine the first directional component and the second directional component, or to combine the first omnidirectional component and the second omnidirectional component to obtain the second combined component.

According to another embodiment, a method for determining a combined converted spatial audio signal, the combined converted spatial audio signal having at least a first combined component and a second combined component, from a first and a second input spatial audio signal, the first input spatial audio signal having a first input audio representation and a first direction of arrival, the second spatial input signal having a second input audio representation and a second direction of arrival, may have the steps of: determining a first converted spatial audio signal, the first converted spatial audio signal having a first omnidirectional component and at least one first directional component, from the first input spatial audio signal, by using the sub-steps of estimating a first wave representation, the first wave representation having a first wave field measure and a first wave direction of arrival measure, based on the first input audio representation and the first input direction of arrival; and processing the first wave field measure and the first wave direction of arrival measure to obtain the first omnidirectional component and the at least one first directional component; providing the first converted signal having the first omnidirectional component and the at least one first directional component; determining a second converted spatial audio signal, the second converted spatial audio signal having a second omnidirectional component and at least one second directional component, from the second input spatial audio signal, by using the sub-steps of estimating a second wave representation, the second wave representation having a second wave field measure and a second wave direction of arrival measure, based on the second input audio representation and the second input direction of arrival; and processing the second wave field measure and the second wave direction of arrival measure to obtain the second omnidirectional component and the at least one second directional component; providing the second converted signal having the second omnidirectional component and the at least one second directional component; rendering the first omnidirectional component to obtain a first rendered component or rendering the first directional component to obtain the first rendered component; combining the first rendered component, the first omnidirectional component and the second omnidirectional component, or combining the first rendered component, the first directional component, and the second directional component to obtain the first combined component; and combining the first directional component and the second directional component, or combining the first omnidirectional component and the second omnidirectional component to obtain the second combined component.

Another embodiment may have a computer program having a program code for performing a method for determining a combined converted spatial audio signal as mentioned above, when the program code runs on a computer processor.

The present invention is based on the finding that improved spatial processing can be achieved, e.g. when converting a spatial audio signal coded as a mono DirAC stream into a B-format signal. In embodiments the converted B-format signal may be processed or rendered before being added to some other audio signals and encoded back to a DirAC stream. Embodiments may have different applications, e.g., mixing different types of DirAC and B-format streams, DirAC based etc. Embodiments may introduce an inverse operation to WO 2004/077884 A1, namely the conversion from a mono DirAC stream into B-format.

The present invention is based on the finding that improved processing can be achieved, if audio signals are converted to directional components. In other words, it is the finding of the present invention that improved spatial processing can be achieved, when the format of a spatial audio signal corresponds to directional components as recorded, for example, by a B-format directional microphone. Moreover, it is a finding of the present invention that directional or omnidirectional components from different sources can be processed jointly and therewith an increased efficiency. In other words, especially when processing spatial audio signals from multiple audio sources, processing can be carried out more efficiently, if the signals of the multiple audio sources are available in the format of their omnidirectional and directional components, as these can be processed jointly.

In embodiments, therefore, audio effect generators or audio processors can be used more efficiently by processing combined components of multiple sources.

In embodiments, spatial audio signals may be represented as a mono DirAC stream denoting a DirAC streaming technique where the media data is accompanied by only one audio channel in transmission. This format can be converted, for example, to a B-format stream, having multiple directional components. Embodiments may enable improved spatial processing by converting spatial audio signals into directional components.

Embodiments may provide an advantage over mono DirAC decoding, where only one audio channel is used to create all loudspeaker signals, in that additional spatial processing is enabled based on directional audio components, which are determined before creating loudspeaker signals. Embodiments may provide the advantage that problems in creation of reverberant sounds are reduced.

In embodiments, for example, a DirAC stream may use a stereo audio signal in place of a mono audio signal, where the stereo channels are L (L=left stereo channel) and R (R=right stereo channel) and are transmitted to be used in DirAC decoding. Embodiments may achieve a better quality for reverberant sound and provide a direct compatibility with stereo loudspeaker systems, for example.

Embodiments may provide the advantage that virtual microphone DirAC decoding can be enabled. Details on virtual microphone DirAC decoding can be found in V. Pulkki, Spatial sound reproduction with directional audio coding, Journal of the Audio Engineering Society, 55(6):503-516, June 2007. These embodiments obtain the audio signals for the loudspeakers placing virtual microphones oriented towards the position of the loudspeakers and having point-like sound sources, whose position is determined by the DirAC parameters. Embodiments may provide the advantage that by the conversion, convenient linear combination of audio signals may be enabled.

BRIEF DESCRIPTION OF THE DRAWINGS

Embodiments of the present invention will be detailed using the accompanying Figs., in which.

DETAILED DESCRIPTION OF THE INVENTION

Figure 1A:
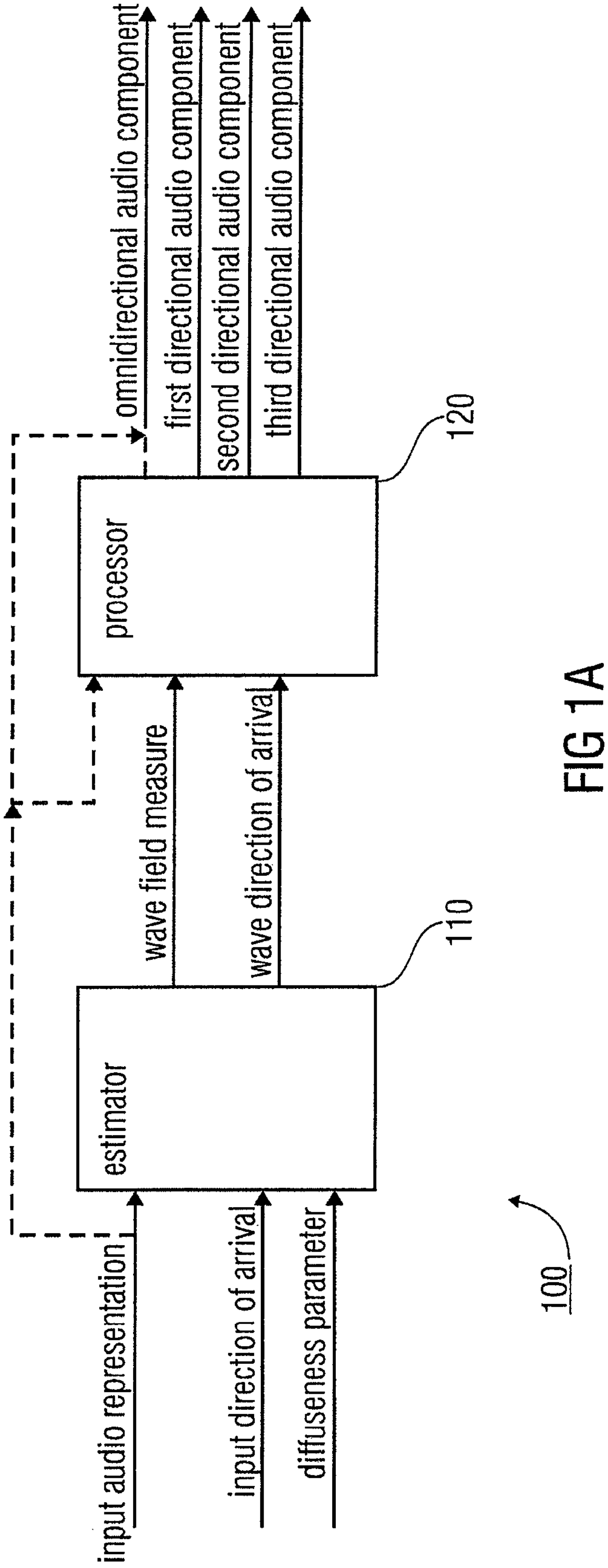
FIG. 1*a* shows an embodiment of an apparatus for determining a converted spatial audio signal.

FIG. 1*a* shows an apparatus 100 for determining a converted spatial audio signal, the converted spatial audio signal having an omnidirectional component and at least one directional component (X;Y;Z), from an input spatial audio signal, the input spatial audio signal having an input audio representation (W) and an input direction of arrival (φ).

The apparatus 100 comprises an estimator 110 for estimating a wave representation comprising a wave field measure and a wave direction of arrival measure based on the input audio representation (W) and the input direction of arrival (φ). Moreover, the apparatus 100 comprises a processor 120 for processing the wave field measure and the wave direction of arrival measure to obtain the omnidirectional component and the at least one directional component. The estimator 110 may be adapted for estimating the wave representation as a plane wave representation.

In embodiments the processor may be adapted for providing the input audio representation (W) as the omnidirectional audio component (W'). In other words, the omnidirectional audio component W' may be equal to the input audio representation W. Therefore, according to the dotted lines in FIG. 1*a*, the input audio representation may bypass the estimator 110, the processor 120, or both. In other embodiments, the omnidirectional audio component W' may be based on the wave intensity and the wave direction of arrival being processed by the processor 120 together with the input audio representation W. In embodiments multiple directional audio components (X;Y;Z) may be processed, as for example a first (X), a second (Y) and/or a third (Z) directional audio component corresponding to different spatial directions. In embodiments, for example three different directional audio components (X;Y;Z) may be derived according to the different directions of a Cartesian coordinate system.

The estimator 110 can be adapted for estimating the wave field measure in terms of a wave field amplitude and a wave field phase. In other words, in embodiments the wave field measure may be estimated as complex valued quantity. The wave field amplitude may correspond to a sound pressure magnitude and the wave field phase may correspond to a sound pressure phase in some embodiments.

In embodiments the wave direction of arrival measure may correspond to any directional quantity, expressed e.g. by a vector, one or more angles etc. and it may be derived from any directional measure representing an audio component as e.g. an intensity vector, a particle velocity vector, etc. The wave field measure may correspond to any physical quantity describing an audio component, which can be real or complex valued, correspond to a pressure signal, a particle velocity amplitude or magnitude, loudness etc. Moreover, measures may be considered in the time and/or frequency domain.

Embodiments may be based on the estimation of a plane wave representation for each of the input streams, which can be carried out by the estimator 110 in FIG. 1*a*. In other words the wave field measure may be modelled using a plane wave representation. In general there exist several equivalent exhaustive (i.e., complete) descriptions of a plane wave or waves in general. In the following a mathematical description will be introduced for computing diffuseness parameters and directions of arrival or direction measures for different components. Although only a few descriptions relate directly to physical quantities, as for instance pressure, particle velocity etc., potentially there exist an infinite number of different ways to describe wave representations, of which one shall be presented as an example subsequently, however, not meant to be limiting in any way to embodiments of the present invention. Any combination may correspond to the wave field measure and the wave direction of arrival measure.

In order to further detail different potential descriptions two real numbers a and b are considered. The information contained in a and b may be transferred by sending c and d, when $$\begin{bmatrix} c \\ d \end{bmatrix} = \Omega \begin{bmatrix} a \\ b \end{bmatrix},$$

wherein Ω is a known 2×2 matrix. The example considers only linear combinations, generally any combination, i.e. also a non-linear combination, is conceivable.

In the following scalars are represented by small letters a,b,c, while column vectors are represented by bold small letters a,b,c. The superscript $(\ )^T$ denotes the transpose, respectively, whereas $\overline{(\bullet)}$ and $(\bullet)^*$ denote complex conjugation. The complex phasor notation is distinguished from the temporal one. For instance, the pressure p(t), which is a real number and from which a possible wave field measure can be derived, can be expressed by means of the phasor P, which is a complex number and from which another possible wave field measure can be derived, by $$p(t)=Re\{Pe^{j\omega t}\},$$

wherein Re{•} denotes the real part and ω=2πf is the angular frequency. Furthermore, capital letters used for physical quantities represent phasors in the following. For the following introductory example notation and to avoid confusion, please note that all quantities with subscript "PW" refer to plane waves.

For an ideal monochromatic plane wave the particle velocity vector $U_{PW}$ can be noted as $$U_{PW} = \frac{P_{PW}}{\rho_0 c} e_d = \begin{bmatrix} U_x \\ U_y \\ U_z \end{bmatrix},$$

where the unit vector $e_d$ points towards the direction of propagation of the wave, e.g. corresponding to a direction measure. It can be proven that $$I_a = \frac{1}{2\rho_0 c} |P_{PW}|^2 e_d \qquad \text{(a)}$$

$$E = \frac{1}{2\rho_0 c^2} |P_{PW}|^2,$$

$$\Psi = 0$$

wherein $I_a$ denotes the active intensity, $\rho_0$ denotes the air density, c denotes the speed of sound, E denotes the sound field energy and Ψ denotes the diffuseness.

Figure 1B:
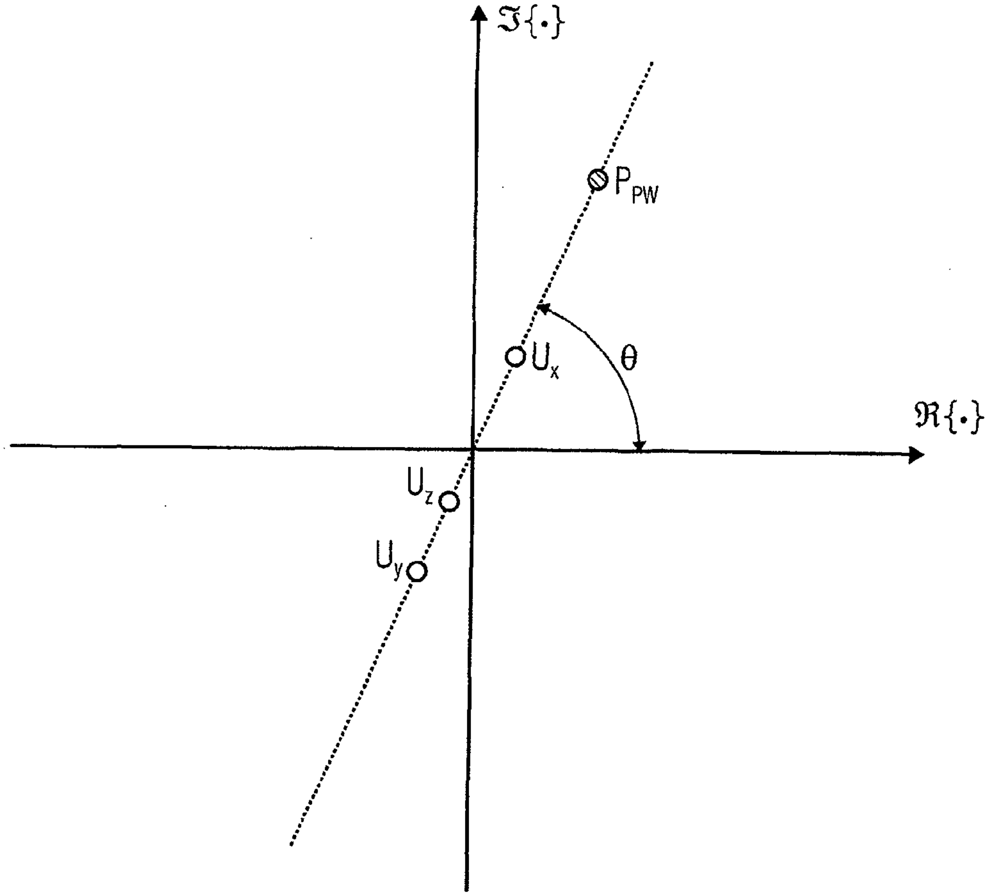
FIG. 1*b* shows pressure and components of a particle velocity vector in a Gaussian plane for a plane wave.

It is interesting to note that since all components of $e_d$ are real numbers, the components of $U_{PW}$ are all in-phase with $P_{PW}$. FIG. 1*b* illustrates an exemplary $U_{PW}$ and $P_{PW}$ in the Gaussian plane. As just mentioned, all components of $U_{PW}$ share the same phase as $P_{PW}$, namely θ. Their magnitudes, on the other hand, are bound to $$\frac{|P_{PW}|}{c} = \sqrt{|U_x|^2 + |U_y|^2 + |U_z|^2} = \|U_{PW}\|.$$

Embodiments of the present invention may provide a method to convert a mono DirAC stream into a B-format signal. A mono DirAC stream may be represented by a pressure signal captured, for example, by an omni-directional microphone and by side information. The side information may comprise time-frequency dependent measures of diffuseness and direction of arrival of sound.

In embodiments the input spatial audio signal may further comprise a diffuseness parameter Ψ and the estimator 110 may be adapted for estimating the wave field measure further based on the diffuseness parameter Ψ.

The input direction of arrival and the wave direction of arrival measure may refer to a reference point corresponding to a recording location of the input spatial audio signal, i.e. in other words all directions may refer to the same reference point. The reference point may be the location where a microphone is placed or multiple directional microphones are placed in order to record sound field.

In embodiments the converted spatial audio signal may comprise a first (X), a second (Y) and a third (Z) directional component. The processor 120 can be adapted for further processing the wave field measure and the wave direction of arrival measure to obtain the first (X) and/or the second (Y) and/or the third (Z) directional components and/or the omni-directional audio components.

In the following notations and a data model will be introduced.

Let p(t) and $u(t)=[u_x(t),u_y(t),u_z(t)]^T$ be the pressure and particle velocity vector, respectively, for a specific point in space, where $[\bullet]^T$ denotes the transpose. p(t) may correspond to an audio representation and $u(t)=[u_x(t),u_y(t),u_z(t)]^T$ may correspond to directional components. These signals can be transformed into a time-frequency domain by means of a proper filter bank or a STFT (STFT=Short Time Fourier Transform) as suggested e.g. by V. Pulkki and C. Faller, Directional audio coding: Filterbank and STFT-based design, in 120th AES Convention, May 20-23, 2006, Paris, France, May 2006.

Let P(k,n) and $U(k,n)=[U_x(k,n),U_y(k,n),U_z(k,n)]^T$ denote the transformed signals, where k and n are indices for frequency (or frequency band) and time, respectively. The active intensity vector $I_a(k,n)$ can be defined as $$I_a(k,n)=1/2Re\{P(k,n)\cdot U^*(k,n)\}, \qquad (1)$$

where $(\bullet)^*$ denotes complex conjugation and Re{•} extracts the real part. The active intensity vector may express the net flow of energy characterizing the sound field, cf. F. J. Fahy, Sound Intensity, Essex: Elsevier Science Publishers Ltd., 1989.

Let c denote the speed of sound in the medium considered and E the sound field energy defined by F. J. Fahy $$E(k,n) = \frac{\rho_0}{4} \|U(k,n)\|^2 + \frac{1}{4\rho_0 c^2} |P(k,n)|^2, \qquad (2)$$

where ||•|| computes the 2-norm. In the following, the content of a mono DirAC stream will be detailed.

The mono DirAC stream may consist of the mono signal p(t) or audio representation and of side information, e.g. a direction of arrival measure. This side information may comprise the time-frequency dependent direction of arrival and a time-frequency dependent measure of diffuseness. The former can be denoted by $e_{DOA}(k,n)$, which is a unit vector pointing towards the direction from which sound arrives, i.e. can be modeling the direction of arrival. The latter, diffuseness, can be denoted by $$\Psi(k,n).$$

In embodiments, the estimator 110 and/or the processor 120 can be adapted for estimating/processing the input DOA and/or the wave DOA measure in terms of a unity vector $e_{DOA}$(k,n). The direction of arrival can be obtained as $$e_{DOA}(k,n)=-e_I(k,n),$$

where the unit vector $e_I$(k,n) indicates the direction towards which the active intensity points, namely $$I_a(k,n)=\|I_a(k,n)\|\cdot e_I(k,n),$$

$$e_I(k,n)=I_a(k,n)/\|I_a(k,n)\|, \tag{3}$$

respectively. Alternatively in embodiments, the DOA or DOA measure can be expressed in terms of azimuth and elevation angles in a spherical coordinate system. For instance, if Φ(k, n) and θ(k,n) are azimuth and elevation angles, respectively, then $$\begin{aligned} e_{DOA}(k,n) &= [\cos(\varphi(k,n))\cdot\cos(\vartheta(k,n)),\ \sin(\varphi(k,n))\cdot \\ &\quad \cos(\vartheta(k,n)),\ \sin(\vartheta(k,n))]^T \\ &= [e_{DOA,x}(k,n),\ e_{DOA,y}(k,n),\ e_{DOA,z}(k,n)], \end{aligned} \tag{4}$$

where $e_{DOA,x}$(k,n) is a the component of the unity vector $e_{DOA}$(k,n) of the input direction of arrival along an x-axis of a Cartesian coordinate system, $e_{DOA,y}$(k,n) is a component of $e_{DOA}$(k,n) along a y-axis and $e_{DOA,z}$(k,n) is a component of $e_{DOA}$(k,n) along a z-axis.

In embodiments, the estimator 110 can be adapted for estimating the wave field measure further based on the diffuseness parameter Ψ, optionally also expressed by Ψ(k,n) in a time-frequency dependent manner. The estimator 110 can be adapted for estimating based on the diffuseness parameter in terms of $$\Psi(k,n) = 1 - \frac{\|\langle I_a(k,n)\rangle_t\|}{c\langle E(k,n)\rangle_t}, \tag{5}$$

where <•>, indicates a temporal average.

There exist different strategies to obtain P(k,n) and U(k,n) in practice. One possibility is to use a B-format microphone, which delivers 4 signals, namely w(t),x(t),y(t) and z(t). The first one, w(t), may correspond to the pressure reading of an omnidirectional microphone. The latter three may correspond to pressure readings of microphones having figure-of-eight pickup patterns directed towards the three axes of a Cartesian coordinate system. These signals are also proportional to the particle-velocity. Therefore, in some embodiments $$\begin{aligned} P(k,n) &= W(k,n) \\ U(k,n) &= -\frac{1}{\sqrt{2}\,\rho_0 c}[X(k,n),\ Y(k,n),\ Z(k,n)]^T \end{aligned} \tag{6}$$

where W(k,n), X(k,n), Y(k,n) and Z(k,n) are the transformed B-format signals corresponding to the omnidirectional component W(k,n) and the three directional components X(k,n), Y(k,n),Z(k,n). Note that the factor $\sqrt{2}$ in (6) comes from the convention used in the definition of B-format signals, cf. Michael Gerzon, Surround sound psychoacoustics, in Wireless World, volume 80, pages 483-486, December 1974.

Alternatively, P(k,n) and U(k,n) can be estimated by means of an omnidirectional microphone array as suggested in J. Merimaa, Applications of a 3-D microphone array, in 112$^{th}$ AES Convention, Paper 5501, Munich, May 2002. The processing steps described above are also illustrated in FIG. 7.

Figure 7:
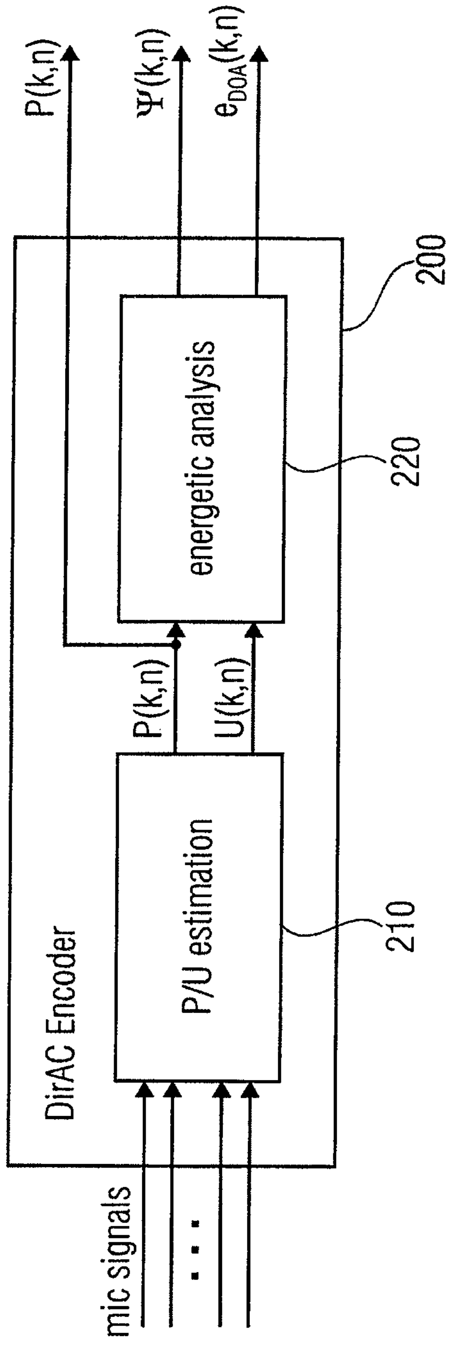
FIG. 7 shows a state of the art DirAC encoder.

FIG. 7 shows a DirAC encoder 200, which is adapted for computing a mono audio channel and side information from proper microphone signals. In other words, FIG. 7 illustrates a DirAC encoder 200 for determining diffuseness Ψ(k,n) and direction of arrival $e_{DOA}$(k,n) from proper microphone signals. FIG. 7 shows a DirAC encoder 200 comprising a P/U estimation unit 210. The P/U estimation unit receives the microphone signals as input information, on which the P/U estimation is based. Since all information is available, the P/U estimation is straight-forward according to the above equations. An energetic analysis stage 220 enables estimation of the direction of arrival and the diffuseness parameter of the combined stream.

Figure 2:
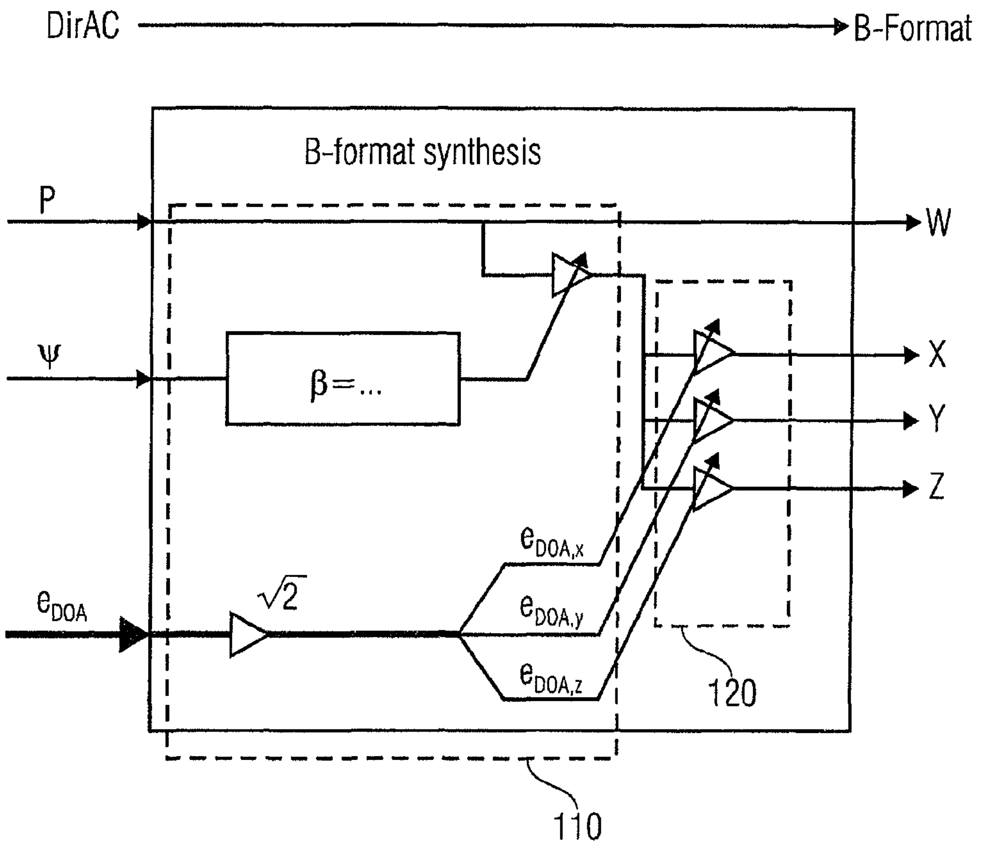
FIG. 2 shows another embodiment for converting a mono DirAC stream to a B-format signal.

In embodiments the estimator 110 can be adapted for determining the wave field measure or amplitude based on a fraction β(k,n) of the input audio representation P(k,n). FIG. 2 shows the processing steps of an embodiment to compute the B-format signals from a mono DirAC stream. All quantities depend on the time and frequency indices (k,n) and are partly omitted in the following for simplicity.

In other words FIG. 2 illustrates another embodiment. According to Eq. (6), W(k,n) is equal to the pressure P(k,n). Therefore, the problem of synthesizing the B-format from a mono DirAC stream reduces to the estimation of the particle velocity vector U(k,n), as its components are proportional to X(k,n), Y(k,n), and Z(k,n).

Embodiments may approach the estimation based on the assumption that the field consists of a plane wave summed to a diffuse field. Therefore, the pressure and particle velocity can be expressed as $$P(k,n)=P_{PW}(k,n)+P_{diff}(k,n) \tag{7}$$

$$U(k,n)=U_{PW}(k,n)+U_{diff}(k,n). \tag{8}$$

where the subscripts "PW" and "diff" denote the plane wave and the diffuse field, respectively.

The DirAC parameters carry information only with respect to the active intensity. Therefore, the particle velocity vector U(k,n) is estimated with $\hat{U}_{PW}$(k,n), which is the estimator for the particle velocity of the plane wave only. It can be defined as $$\hat{U}_{PW}(k,n) = -\frac{1}{\rho_0 c}\beta(k,n)\cdot P(k,n)\cdot e_{DOA}(k,n), \tag{9}$$

where the real number β(k,n) is a proper weighting factor, which in general is frequency dependent and may exhibit an inverse proportionality to diffuseness Ψ(k,n). In fact, for low diffuseness, i.e., Ψ(k,n) close to 0, it can be assumed that the field is composed of a single plane wave, so that $$U_{PW}(k,n) \approx -\frac{1}{\rho_0 c}P(k,n)\cdot e_{DOA}(k,n) = \hat{U}_{PW}(k,n)\,\big|_{\beta(k,n)=1}, \tag{10}$$

implying that β(k,n)=1.

In other words the estimator 110 can be adapted for estimating the wave field measure with a high amplitude for a low diffuseness parameter $\Psi$ and for estimating the wave field measure with a low amplitude for a high diffuseness parameter $\Psi$. In embodiments the diffuseness parameter $\Psi=[0 \ldots 1]$. The diffuseness parameter may indicate a relation between an energy in a directional component and an energy in an omnidirectional component. In embodiments the diffuseness parameter $\Psi$ may be a measure for a spatial wideness of a directional component.

Considering the equation above and Eq. (6), the omnidirectional and/or the first and/or second and/or third directional components can be expressed as $$W(k,n)=P(k,n)$$

$$X(k,n)=\sqrt{2}\beta(k,n)\cdot P(k,n)\cdot e_{DOA,x}(k,n)$$

$$Y(k,n)=\sqrt{2}\beta(k,n)\cdot P(k,n)\cdot e_{DOA,y}(k,n)$$

$$Z(k,n)=\sqrt{2}\beta(k,n)\cdot P(k,n)\cdot e_{DOA,z}(k,n)$$

where $e_{DOA,x}(k,n)$ is the component of the unity vector $e_{DOA}(k,n)$ of the input direction of arrival along the x-axis of a Cartesian coordinate system, $e_{DOA,y}(k,n)$ is the component of $e_{DOA}(k,n)$ along the y-axis and $e_{DOA,z}(k,n)$ is the component of $e_{DOA}(k,n)$ along the z-axis. In the embodiment shown in FIG. 2 the wave direction of arrival measure estimated by the estimator 110 corresponds to $e_{DOA,x}(k,n)$, $e_{DOA,y}(k,n)$ and $e_{DOA,z}(k,n)$ and the wave field measure corresponds to $\beta(k,n)$ $P(k,n)$. The first directional component as output by the processor 120 may correspond to any one of X(k,n), Y(k,n) or Z(k,n) and the second directional component accordingly to any other one of X(k,n), Y(k,n) or Z(k,n).

In the following, two practical embodiments will be presented on how to determine the factor $\beta(k,n)$.

The first embodiment aims at estimating the pressure of a plane wave first, namely $P_{PW}(k,n)$, and then, from it, derive the particle velocity vector.

Setting the air density $\rho_0$ equal to 1, and dropping the functional dependency (k,n) for simplicity, it can be written $$\psi = 1 - \frac{\langle |P_{PW}|^2 \rangle_t}{\langle |P_{PW}|^2 \rangle_t + 2c^2 \langle E_{diff} \rangle_t}. \tag{12}$$

Given the statistical properties of diffuse fields, an approximation can be introduced by $$\langle |P_{PW}|^2 \rangle_t + 2c^2 \langle E_{diff} \rangle_t \approx \langle |P|^2 \rangle_t, \tag{13}$$

where is the energy of the diffuse field. The estimator can thus be obtained by $$\langle |P_{PW}| \rangle_t \approx \langle |\hat{P}_{PW}| \rangle_t = \sqrt{1-\Psi} \langle |P| \rangle_t. \tag{14}$$

To compute instantaneous estimates, i.e. for each time frequency tile, the expectation operators can be removed, obtaining $$\hat{P}_{PW}(k,n)=\sqrt{1-\Psi(k,n)}P(k,n) \tag{15}$$

By exploiting the plane wave assumption, the estimate for the particle velocity can be derived directly $$\hat{U}_{PW}(k,n) = \frac{1}{\rho_0 c} \hat{P}_{PW}(k,n) \cdot e_I(k,n), \tag{16}$$

from which it follows that $$\beta(k,n)=\sqrt{1-\Psi(k,n)}. \tag{17}$$

In other words, the estimator 110 can be adapted for estimating the fraction $\beta(k,n)$ based on the diffuseness parameter $\Psi(k,n)$, according to $$\beta(k,n)=\sqrt{1-\Psi(k,n)}$$

and the wave field measure according to $$\beta(k,n)P(k,n),$$

wherein the processor 120 can be adapted to obtain the magnitude of the first directional component X(k,n) and/or the second directional component Y(k,n) and/or the third directional component Z(k,n) and/or the omnidirectional audio component W(k,n) by $$W(k,n)=P(k,n)$$

$$X(k,n)=\sqrt{2}\beta(k,n)\cdot P(k,n)\cdot e_{DOA,x}(k,n)$$

$$Y(k,n)=\sqrt{2}\beta(k,n)\cdot P(k,n)\cdot e_{DOA,y}(k,n)$$

$$Z(k,n)=\sqrt{2}\beta(k,n)\cdot P(k,n)\cdot e_{DOA,z}(k,n)$$

wherein the wave direction of arrival measure is represented by the unity vector $[e_{DOA,x}(k,n), e_{DOA,y}(k,n), e_{DOA,z}(k,n)]^T$ where x, y, and z indicate the directions of a Cartesian coordinate system.

An alternative solution in embodiments can be derived by obtaining the factor $\beta(k,n)$ directly from the expression of the diffuseness $\Psi(k,n)$. As already mentioned, the particle velocity U(k,n) can be modeled as $$U(k,n) = \beta(k,n) \cdot \frac{P(k,n)}{\rho_0 c} \cdot e_I(k,n). \tag{18}$$

Eq. (18) can be substituted into (5) leading to $$\Psi(k,n) = 1 - \frac{\frac{1}{\rho_0 c} \| \langle |\beta(k,n) \cdot P(k,n)|^2 \cdot e_I(k,n) \rangle_t \|}{c \left\langle \frac{1}{2\rho_0 c^2} |P(k,n)|^2 \cdot (\beta^2(k,n)+1) \right\rangle_t}. \tag{19}$$

To obtain instantaneous values the expectation operators can be removed and solving for $\beta(k,n)$ yields $$\beta(k,n) = \frac{1-\sqrt{1-(1-\Psi(k,n))^2}}{1-\Psi(k,n)}. \tag{20}$$

In other words, in embodiments the estimator 110 can be adapted for estimating the fraction $\beta(k,n)$ based on $\Psi(k,n)$ according to $$\beta(k,n) = \frac{1-\sqrt{1-(1-\Psi(k,n))^2}}{1-\Psi(k,n)}.$$

In embodiments the input spatial audio signal can correspond to a mono DirAC signal. Embodiments may be extended for processing other streams. In case that the stream or the input spatial audio signal does not carry an omnidirectional channel, embodiments may combine the available channels to approximate an omnidirectional pickup pattern. For instance, in case of a stereo DirAC stream as input spatial audio signal, the pressure signal P in FIG. 2 can be approximated by summing the channels L and R.

In the following an embodiment with Ψ=1 will be illuminated. FIG. 2 illustrates that if the diffuseness is equal to one for both embodiments the sound is routed exclusively to channel W as β equals zero, so that the signals X,Y and Z, i.e. the directional components, are also zero. If Ψ=1 constantly in time, the mono audio channel can thus be routed to the W-channel without any further computations. The physical interpretation of this is that the audio signal is presented to the listener as being a pure reactive field, as the particle velocity vector has zero magnitude.

Another case when Ψ=1 occurs considering a situation where an audio signal is present only in one or any subset of dipole signals, and not in W signal. In DirAC diffuseness analysis this scenario is analyzed to have Ψ=1 with Eq. 5, since the intensity vector has constantly the length of zero as pressure P is zero in Eq. (1). The physical interpretation of this is also that the audio signal is presented to the listener being reactive, as this time pressure signal is constantly zero, while the particle velocity vector is non-zero.

Due to the fact that B-format is inherently a loudspeaker-setup independent representation, embodiments may use the B-format as a common language spoken by different audio devices, meaning that the conversion from one to another can be made possible by embodiments via an intermediate conversion into B-format. For example, embodiments may join DirAC streams from different recorded acoustical environments with different synthesized sound environments in B-format. The joining of mono DirAC streams to B-format streams may also be enabled by embodiments.

Embodiments may enable the joining of multichannel audio signals in any surround format with a mono DirAC stream. Furthermore, embodiments may enable the joining of a mono DirAC stream with any B-format stream. Moreover, embodiments may enable the joining of a mono DirAC stream with a B-format stream.

These embodiments can provide an advantage e.g., in creation of reverberation or introducing audio effects, as will be detailed subsequently. In music production, reverberators can be used as effect devices which perceptually place the processed audio into a virtual space. In virtual reality, synthesis of reverberation may be needed when virtual sources are auralized inside a closed space, e.g., in rooms or concert halls.

When a signal for reverberation is available, such auralization can be performed by embodiments by applying dry sound and reverberated sound to different DirAC streams. Embodiments may use different approaches on how to process the reverberated signal in the DirAC context, where embodiments may produce the reverberated sound being maximally diffuse around the listener.

Figure 3:
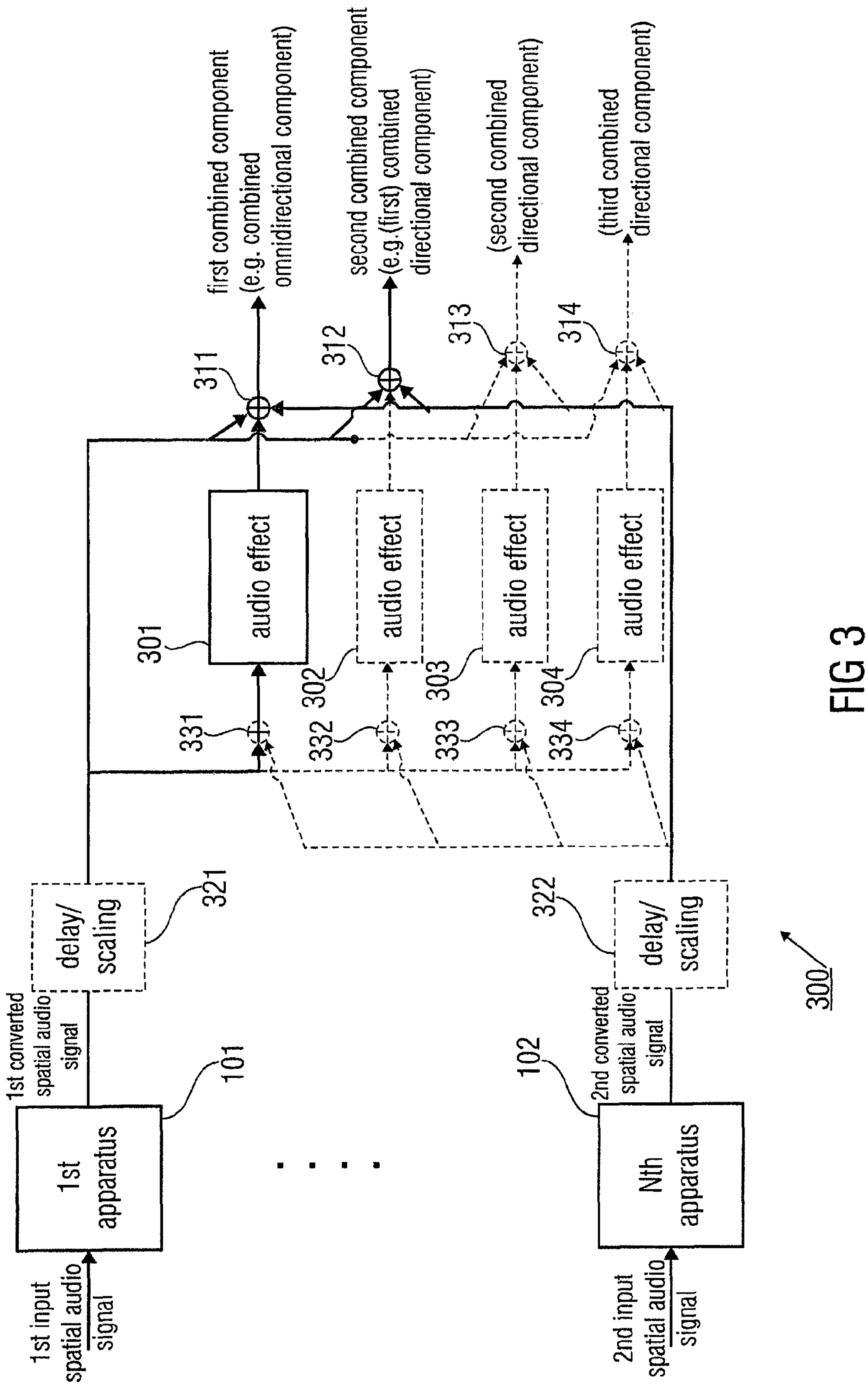
FIG. 3 shows an embodiment for combining multiple converted spatial audio signals.

FIG. 3 illustrates an embodiment of an apparatus 300 for determining a combined converted spatial audio signal, the combined converted spatial audio signal having at least a first combined component and a second combined component, wherein the combined converted spatial audio signal is determined from a first and a second input spatial audio signal having a first and a second input audio representation and a first and a second direction of arrival.

The apparatus 300 comprises a first embodiment of the apparatus 101 for determining a converted spatial audio signal according to the above description, for providing a first converted signal having a first omnidirectional component and at least one directional component from the first apparatus 101. Moreover, the apparatus 300 comprises another embodiment of an apparatus 102 for determining a converted spatial audio signal according to the above description for providing a second converted signal, having a second omnidirectional component and at least one directional component from the second apparatus 102.

Generally, embodiments are not limited to comprising only two of the apparatuses 100, in general, a plurality of the above-described apparatuses may be comprised in the apparatus 300, e.g., the apparatus 300 may be adapted for combining a plurality of DirAC signals.

According to FIG. 3, the apparatus 300 further comprises an audio effect generator 301 for rendering the first omnidirectional or the first directional audio component from the first apparatus 101 to obtain a first rendered component.

Furthermore, the apparatus 300 comprises a first combiner 311 for combining the first rendered component with the first and second omnidirectional components, or for combining the first rendered component with the directional components from the first apparatus 101 and the second apparatus 102 to obtain the first, combined component. The apparatus 300 further comprises a second combiner 312 for combining the first and second omnidirectional components or the directional components from the first or second apparatuses 101 and 102 to obtain the second combined component.

In other words, the audio effect generator 301 may render the first omnidirectional component so the first combiner 311 may then combine the rendered first omnidirectional component, the first omnidirectional component and the second omnidirectional component to obtain the first combined component. The first combined component may then correspond, for example, to a combined omnidirectional component. In this embodiment, the second combiner 312 may combine the directional component from the first apparatus 101 and the directional component from the second apparatus to obtain the second combined component, for example, corresponding to a first combined directional component.

In other embodiments, the audio effect generator 301 may render the directional components. In these embodiments the combiner 311 may combine the directional component from the first apparatus 101, the directional component from the second apparatus 102 and the first rendered component to obtain the first combined component, in this case corresponding to a combined directional component. In this embodiment the second combiner 312 may combine the first and second omnidirectional components from the first apparatus 101 and the second apparatus 102 to obtain the second combined component, i.e., a combined omnidirectional component.

In other words, FIG. 3 shows an embodiment of an apparatus 300 adapted to determine a combined converted spatial audio signal, the combined converted spatial audio signal having at least a first combined component and a second combined component, from a first and a second input spatial audio signal, the first input spatial audio signal having a first input audio representation and a first direction of arrival, the second spatial input signal having a second input audio representation and a second direction of arrival.

The apparatus 300 comprises a first apparatus 101 comprising an apparatus 100 adapted to determine a converted spatial audio signal, the converted spatial audio signal having an omnidirectional audio component W' and at least one directional audio component X;Y;Z, from an input spatial audio signal, the input spatial audio signal having an input audio representation and an input direction of arrival. The apparatus 100 comprises an estimator 110 adapted to estimate a wave representation, the wave representation comprising a wave field measure and a wave direction of arrival measure, based on the input audio representation and the input direction of arrival.

Moreover, the apparatus 100 comprises a processor 120 adapted to process the wave field measure and the wave direction of arrival measure to obtain the omnidirectional component (W') and the at least one directional component (X;Y;Z). The first apparatus 101 is adapted to provide a first converted signal based on the first input spatial audio signal, having a first omnidirectional component and at least one directional component from the first apparatus 101.

Furthermore, the apparatus 300 comprises a second apparatus 102 comprising an other apparatus 100 adapted to provide a second converted signal based on the second input spatial audio signal, having a second omnidirectional component and at least one directional component from the second apparatus 102. Moreover, the apparatus 300 comprises an audio effect generator 301 adapted to render the first omnidirectional component to obtain a first rendered component or to render the directional component from the first apparatus 101 to obtain the first rendered component.

Furthermore, the apparatus 300 comprises a first combiner 311 adapted to combine the first rendered component, the first omnidirectional component and the second omnidirectional component, or to combine the first rendered component, the directional component from the first apparatus 101, and the directional component from the second apparatus 102 to obtain the first combined component. The apparatus 300 comprises a second combiner 312 adapted to combine the directional component from the first apparatus 101 and the directional component from the second apparatus 102, or to combine the first omnidirectional component and the second omnidirectional component to obtain the second combined component.

In other words, FIG. 3 shows an embodiment of an apparatus 300 adapted to determine a combined converted spatial audio signal, the combined converted spatial audio signal having at least a first combined component and a second combined component, from a first and a second input spatial audio signal, the first input spatial audio signal having a first input audio representation and a first direction of arrival, the second spatial input signal having a second input audio representation and a second direction of arrival. The apparatus 300 comprises a first means 101 adapted to determine a first converted signal, the first converted signal having a first omnidirectional component and at least one first directional component (X;Y;Z), from the first input spatial audio signal. The first means 101 may comprise an embodiment of the above-described apparatus 100.

The first means 101 comprises an estimator adapted to estimate a first wave representation, the first wave representation comprising a first wave field measure and a first wave direction of arrival measure, based on the first input audio representation and the first input direction of arrival. The estimator may correspond to an embodiment of the above-described estimator 110.

The first means 101 further comprises a processor adapted to process the first wave field measure and the first wave direction of arrival measure to obtain the first omnidirectional component and the at least one first directional component. The processor may correspond to an embodiment of the above-described processor 120.

The first means 101 may be further adapted to provide the first converted signal having the first omnidirectional component and the at least one first directional component.

Moreover, the apparatus 300 comprises a second means 102 adapted to provide a second converted signal based on the second input spatial audio signal, having a second omnidirectional component and at least one second directional component. The second means may comprise an embodiment of the above-described apparatus 100.

The second means 102 further comprises an other estimator adapted to estimate a second wave representation, the second wave representation comprising a second wave field measure and a second wave direction of arrival measure, based on the second input audio representation and the second input direction of arrival. The other estimator may correspond to an embodiment of the above-described estimator 110.

The second means 102 further comprises an other processor adapted to process the second wave field measure and the second wave direction of arrival measure to obtain the second omnidirectional component and the at least one second directional component. The other processor may correspond to an embodiment of the above-described processor 120.

Furthermore, the second means 101 is adapted to provide the second converted signal having the second omnidirectional component and at least one second directional component.

Moreover, the apparatus 300 comprises an audio effect generator 301 adapted to render the first omnidirectional component to obtain a first rendered component or to render the first directional component to obtain the first rendered component. The apparatus 300 comprises a first combiner 311 adapted to combine the first rendered component, the first omnidirectional component and the second omnidirectional component, or to combine the first rendered component, the first directional component, and the second directional component to obtain the first combined component.

Furthermore, the apparatus 300 comprises a second combiner 312 adapted to combine the first directional component and the second directional component, or to combine the first omnidirectional component and the second omnidirectional component to obtain the second combined component.

In embodiments, a method for determining a combined converted spatial audio signal may be performed, the combined converted spatial audio signal having at least a first combined component and a second combined component, from a first and a second input spatial audio signal, the first input spatial audio signal having a first input audio representation and a first direction of arrival, the second spatial input signal having a second input audio representation and a second direction of arrival.

The method may comprise the steps of determining a first converted spatial audio signal, the first converted spatial audio signal having a first omnidirectional component (W') and at least one first directional component (X;Y;Z), from the first input spatial audio signal, by using the sub-steps of estimating a first wave representation, the first wave representation comprising a first wave field measure and a first wave direction of arrival measure, based on the first input audio representation and the first input direction of arrival; and processing the first wave field measure and the first wave direction of arrival measure to obtain the first omnidirectional component (W') and the at least one first directional component (X;Y;Z).

The method may further comprise a step of providing the first converted signal having the first omnidirectional component and the at least one first directional component.

Moreover, the method may comprise determining a second converted spatial audio signal, the second converted spatial audio signal having a second omnidirectional component (W') and at least one second directional component (X;Y;Z), from the second input spatial audio signal, by using the sub-steps of estimating a second wave representation, the second wave representation comprising a second wave field measure and a second wave direction of arrival measure, based on the second input audio representation and the second input direction of arrival; and processing the second wave field measure and the second wave direction of arrival measure to obtain the second omnidirectional component (W') and the at least one second directional component (X;Y;Z).

Furthermore the method may comprise providing the second converted signal having the second omnidirectional component and the at least one second directional component.

The method may further comprise rendering the first omnidirectional component to obtain a first rendered component or rendering the first directional component to obtain the first rendered component; and combining the first rendered component, the first omnidirectional component and the second omnidirectional component, or combining the first rendered component, the first directional component, and the second directional component to obtain the first combined component.

Moreover, the method may comprise combining the first directional component and the second directional component, or combining the first omnidirectional component and the second omnidirectional component to obtain the second combined component.

According to the above-described embodiments, each of the apparatuses may produce multiple directional components, for example an X, Y and Z component. In embodiments multiple audio effect generators may be used, which is indicated in FIG. 3 by the dashed boxes 302, 303 and 304. These optional audio effect generators may generate corresponding rendered components, based on omnidirectional and/or directional input signals. In one embodiment, an audio effect generator may render a directional component on the basis of an omnidirectional component. Moreover, the apparatus 300 may comprise multiple combiners, i.e., combiners 311, 312, 313 and 314 in order to combine an omnidirectional combined component and multiple combined directional components, for example, for the three spatial dimensions.

One of the advantages of the structure of the apparatus 300 is that a maximum of four audio effect generators is needed for generally rendering an unlimited number of audio sources.

As indicated by the dashed combiners 331, 332, 333 and 334 in FIG. 3, an audio effect generator can be adapted for rendering a combination of directional or omnidirectional components from the apparatuses 101 and 102. In one embodiment the audio effect generator 301 can be adapted for rendering a combination of the omnidirectional components of the first apparatus 101 and the second apparatus 102, or for rendering a combination of the directional components of the first apparatus 101 and the second apparatus 102 to obtain the first rendered component. As indicated by the dashed paths in FIG. 3, combinations of multiple components may be provided to the different audio effect generators.

In one embodiment all the omnidirectional components of all sound sources, in FIG. 3 represented by the first apparatus 101 and the second apparatus 102, may be combined in order to generate multiple rendered components. In each of the four paths shown in FIG. 3 each audio effect generator may generate a rendered component to be added to the corresponding directional or omnidirectional components from the sound sources.

Moreover, as shown in FIG. 3, multiple delay and scaling stages 321 and 322 may be used. In other words, each apparatus 101 or 102 may have in its output path one delay and scaling stage 321 or 322, in order to delay one or more of its output components. In some embodiments, the delay and scaling stages may delay and scale the respective omnidirectional components, only. Generally, delay and scaling stages may be used for omnidirectional and directional components.

In embodiments the apparatus 300 may comprise a plurality of apparatuses 100 representing audio sources and correspondingly a plurality of audio effect generators, wherein the number of audio effect generators is less than the number of apparatuses corresponding to the sound sources. As already mentioned above, in one embodiment there may be up to four audio effect generators, with a basically unlimited number of sound sources. In embodiments an audio effect generator may correspond to a reverberator.

Figure 4A:
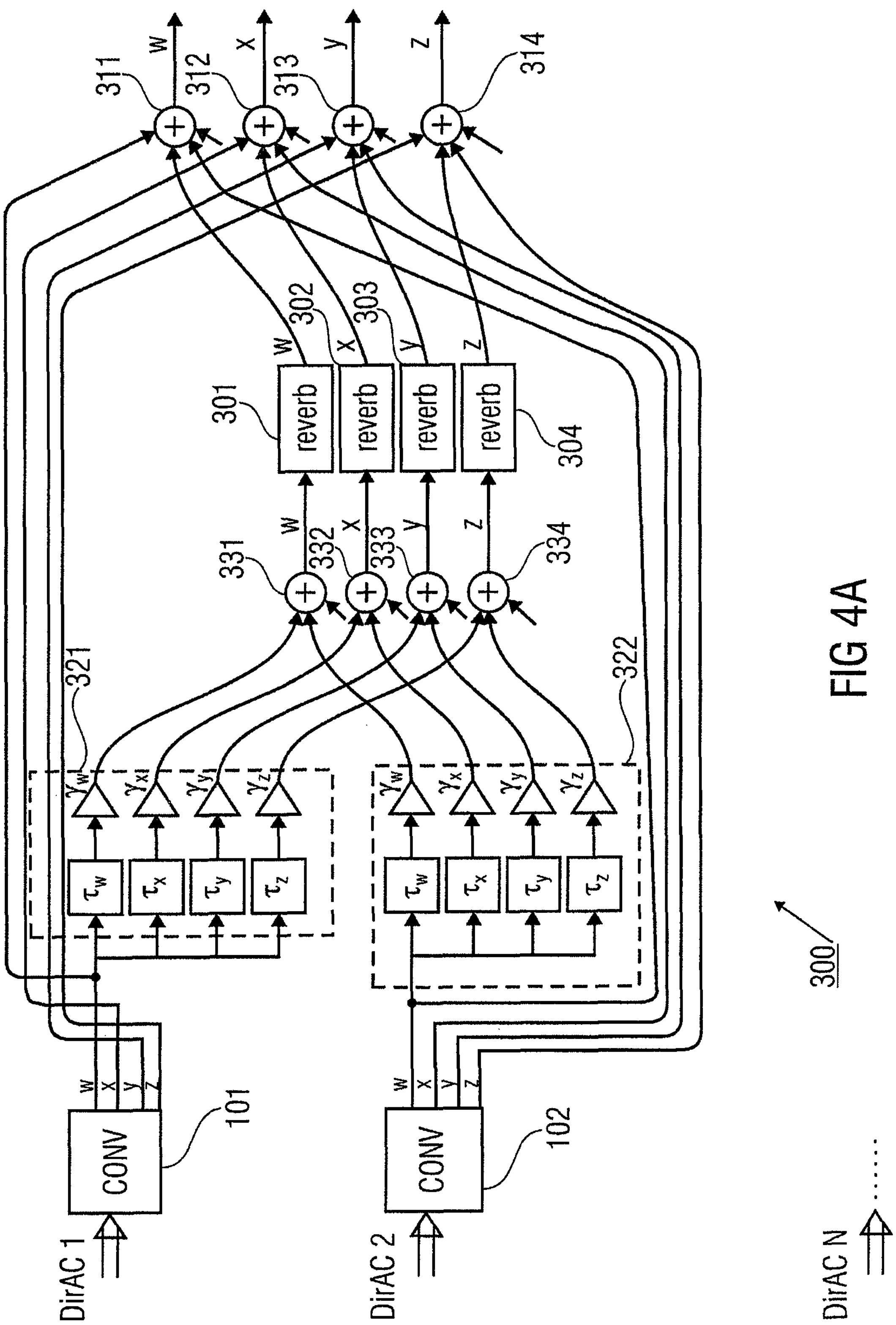
FIGS. 4*a*-4*d* show embodiments for combining multiple DirAC-based spatial audio signals applying different audio effects.

FIG. 4*a* shows another embodiment of an apparatus 300 in more detail. FIG. 4*a* shows two apparatuses 101 and 102 each outputting an omnidirectional audio component W, and three directional components X, Y, Z. According to the embodiment shown in FIG. 4*a* the omnidirectional components of each of the apparatuses 101 and 102 are provided to two delay and scaling stages 321 and 322, which output three delayed and scaled components, which are then added by combiners 331, 332, 333 and 334. Each of the combined signals is then rendered separately by one of the four audio effect generators 301, 302, 303 and 304, which are implemented as reverberators in FIG. 4*a*. As indicated in FIG. 4*a* each of the audio effect generators outputs one component, corresponding to one omnidirectional component and three directional components in total. The combiners 311, 312, 313 and 314 are then used to combine the respective rendered components with the original components output by the apparatuses 101 and 102, where in FIG. 4*a* generally there can be a multiplicity of apparatuses 100.

In other words, in combiner 311 a rendered version of the combined omnidirectional output signals of all the apparatuses may be combined with the original or un-rendered omnidirectional output components. Similar combinations can be carried out by the other combiners with respect to the directional components. In the embodiment shown in FIG. 4*a*, rendered directional components are created based on delayed and scaled versions of the omnidirectional components.

Generally, embodiments may apply an audio effect as for instance a reverberation efficiently to one or more DirAC streams. For example, at least two DirAC streams are input to the embodiment of apparatus 300, as shown in FIG. 4*a*. In embodiments these streams may be real DirAC streams or synthesized streams, for instance by taking a mono signal and adding side information as a direction and diffuseness.

According to the above discussion, the apparatuses 101, 102 may generate up to four signals for each stream, namely W, X, Y and Z. Generally, embodiments of the apparatuses 101 or 102 may provide less than three directional components, for instance only X, or X and Y, or any other combination thereof.

In some embodiments the omnidirectional components W may be provided to audio effect generators, as for instance reverberators in order to create the rendered components. In some embodiments for each of the input DirAC streams the signals may be copied to the four branches shown in FIG. 4*a*, which may be independently delayed, i.e., individually per apparatus 101 or 102 four independently delayed, e.g. by delays $\tau_W,\tau_X,\tau_Y,\tau_Z$, and scaled, e.g. by scaling factors $\gamma_w,\gamma_X,\gamma_Y,\gamma_Z$, versions may be combined before being provided to an audio effect generator.

According to FIGS. 3 and 4*a*, the branches of the different streams, i.e., the outputs of the apparatuses 101 and 102, can be combined to obtain four combined signals. The combined signals may then be independently rendered by the audio generators, for example conventional mono reverberators.

The resulting rendered signals may then be summed to the W, X, Y and Z signals output originally from the different apparatuses 101 and 102.

In embodiments, general B-format signals may be obtained, which can then, for example, be played with a B-format decoder as it is for example carried out in Ambisonics. In other embodiments the B-format signals may be encoded as for example with the DirAC encoder as shown in FIG. 7, such that the resulting DirAC stream may then be transmitted, further processed or decoded with a conventional mono DirAC decoder. The step of decoding may correspond to computing loudspeaker signals for playback.

Figure 4B:
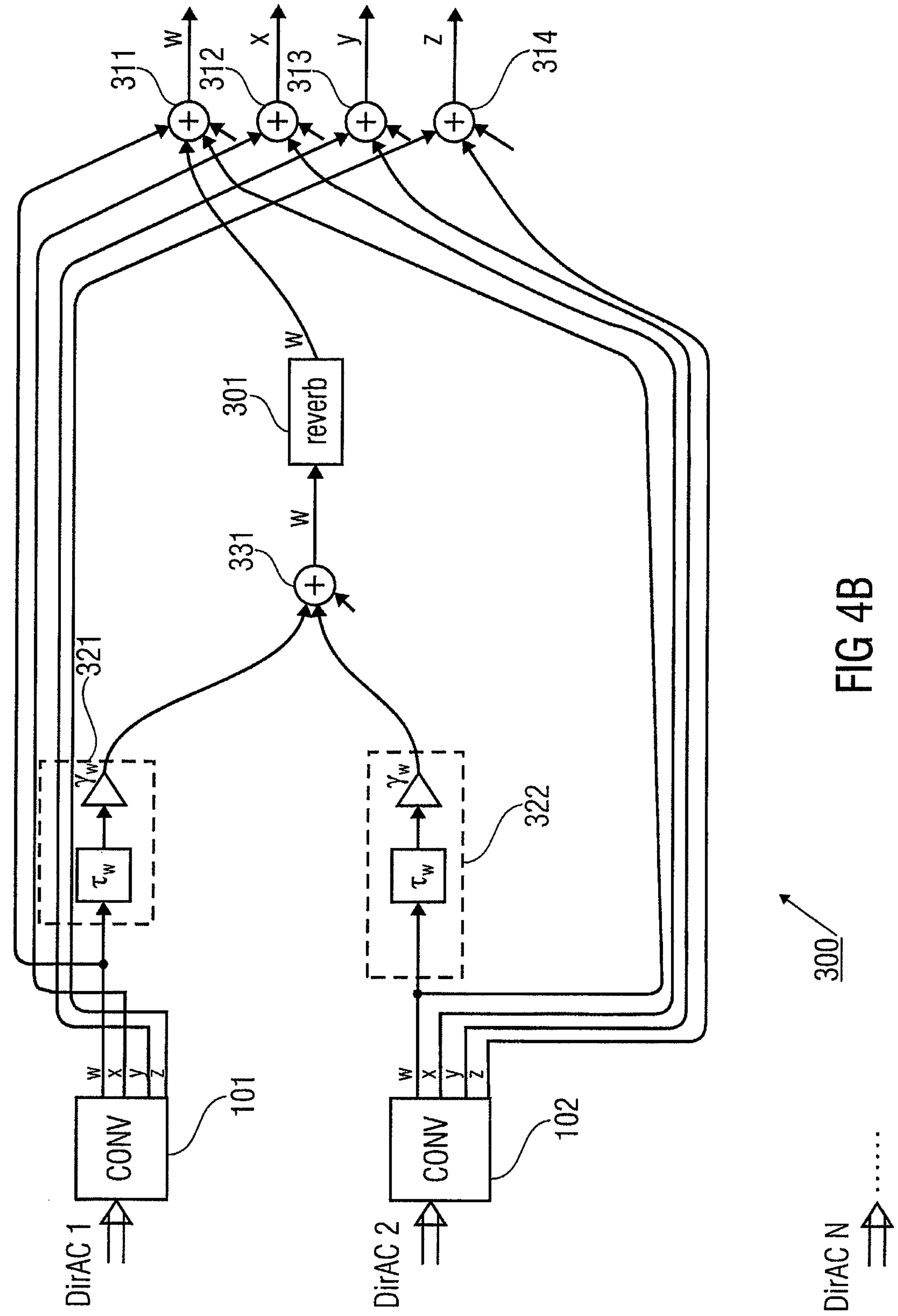

FIG. 4*b* shows another embodiment of an apparatus 300. FIG. 4*b* shows the two apparatuses 101 and 102 with the corresponding four output components. In the embodiment shown in FIG. 4*b*, only the omnidirectional W components are used to be first individually delayed and scaled in the delay and scaling stages 321 and 322 before being combined by combiner 331. The combined signal is then provided to audio effect generator 301, which is again implemented as a reverberator in FIG. 4*b*. The rendered output of the reverberator 301 is then combined with the original omnidirectional components from the apparatuses 101 and 102 by the combiner 311. The other combiners 312, 313 and 314 are used to combine the directional components X, Y and Z from the apparatuses 101 and 102 in order to obtain corresponding combined directional components.

In a relation to the embodiment depicted in FIG. 4*a*, the embodiment depicted in FIG. 4*b* corresponds to setting the scaling factors for the branches X, Y and Z to 0. In this embodiment, only one audio effect generator or reverberator 301 is used. In one embodiment the audio effect generator 301 can be adapted for reverberating the first omnidirectional component only to obtain the first rendered component, i.e. only W may be reverberated.

In general, as the apparatuses 101, 102 and potentially N apparatuses corresponding to N sound sources, the potentially N delay and scaling stages 321, which are optional, may simulate the sound sources' distances, a shorter delay may correspond to the perception of a virtual sound source closer to the listener. Generally, the delay and scaling stage 321, may be used to render a spatial relation between different sound sources represented by the converted signal, converted spatial audio signals respectively. The spatial impression of a surrounding environment may then be created by the corresponding audio effect generators 301 or reverberators. In other words, in some embodiments delay and scaling stages 321 may be used to introduce source specific delays and scaling relative to the other sound sources. A combination of the properly related, i.e. delayed and scaled, converted signals can then be adapted to a spatial environment by the audio effect generator 301.

The delay and scaling stage 321 may be seen as a sort of reverberator as well. In embodiments, the delay introduced by the delay and scaling stage 321 can be shorter than a delay introduced by the audio effect generator 301. In some embodiments a common time basis, as e.g. provided by a clock generator, may be used for the delay and scaling stage 321 and the audio effect generator 301. A delay may then be expressed in terms of a number of sample periods and the delay introduced by the delay and scaling stage 321 can correspond to a lower number of sample periods than a delay introduced by the audio effect generator 301.

Embodiments as depicted in FIGS. 3, 4*a* and 4*b* may be utilized for cases when mono DirAC decoding is used for N sound sources which are then jointly reverberated. As the output of a reverberator can be assumed to have an output which is totally diffuse, i.e., it may be interpreted as an omnidirectional signal W as well. This signal may be combined with other synthesized B-format signals, such as the B-format signals originated from N audio sources themselves, thus representing the direct path to the listener. When the resulting B-format signal is further DirAC encoded and decoded, the reverberated sound can be made available by embodiments.

Figure 4C:
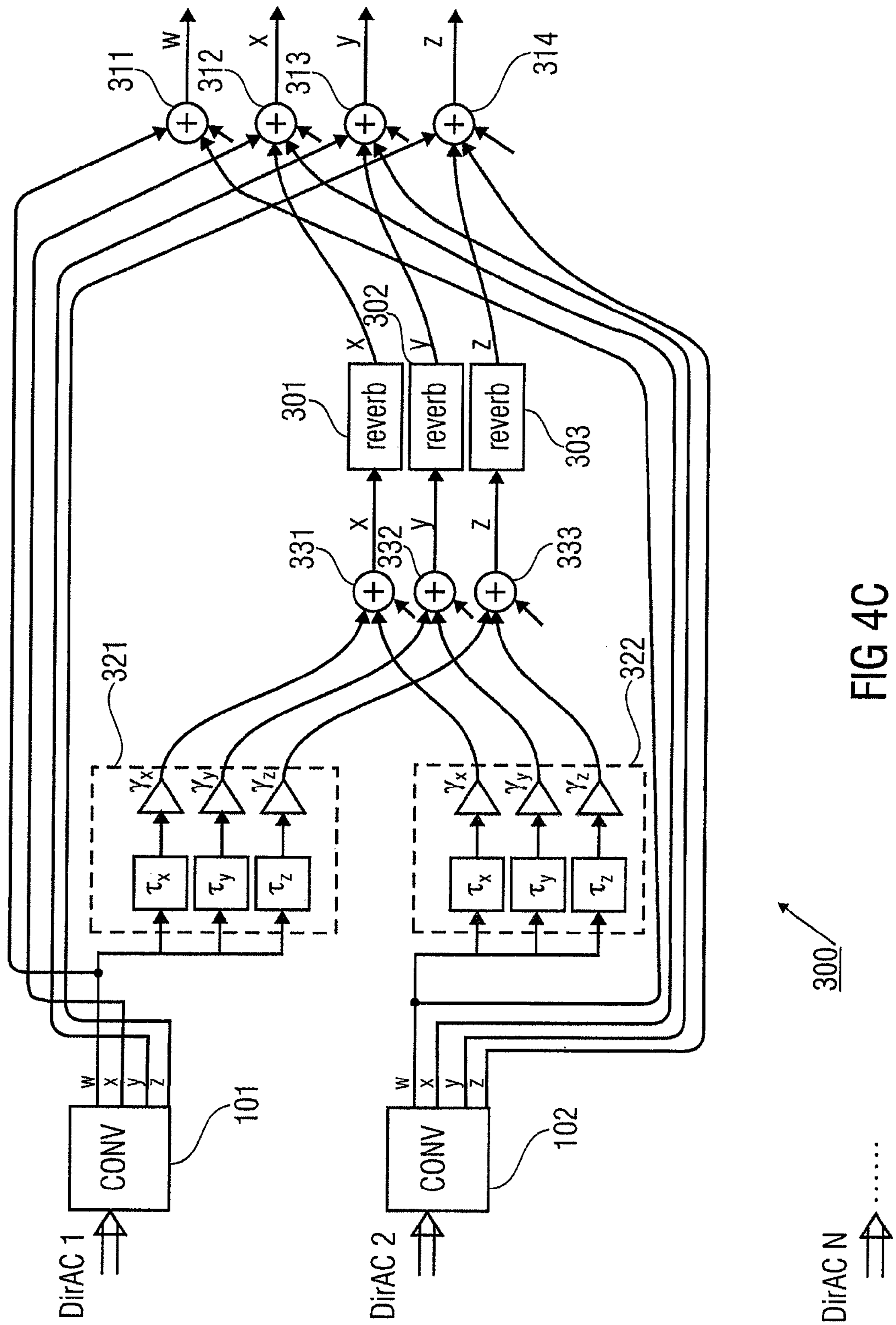

In FIG. 4*c* another embodiment of the apparatus 300 is shown. In the embodiment shown in FIG. 4*c*, based on the output omnidirectional signals of the apparatuses 101 and 102, directional reverberated rendered components are created. Therefore, based on the omnidirectional output, the delay and scaling stages 321 and 322 create individually delayed and scaled components, which are combined by combiners 331, 332 and 333. To each of the combined signals different reverberators 301, 302 and 303 are applied, which in general correspond to different audio effect generators. According to the above description the corresponding omnidirectional, directional and rendered components are combined by the combiners 311, 312, 313 and 314, in order to provide a combined omnidirectional component and combined directional components.

In other words, the W-signals or omnidirectional signals for each stream are fed to three audio effect generators, as for example reverberators, as shown in the figures. Generally, there can also be only two branches depending on whether a two-dimensional or three-dimensional sound signal is to be generated. Once the B-format signals are obtained, the streams may be decoded via a virtual microphone DirAC decoder. The latter is described in detail in V. Pulkki, Spatial Sound Reproduction With Directional Audio Coding, Journal of the Audio Engineering Society, 55 (6): 503-516.

With this decoder the loudspeaker signals $D_p(k,n)$ can be obtained as a linear combination of the W,X,Y and Z signals, for example according to $$D_p(k,n)=G(k,n)[W(k,n)\sqrt{2}+X(k,n)\cos(\alpha_p)\cos(\beta_p)+Y(k,n)\sin(\alpha_p)\cos(\beta_p)+Z(k,n)\sin(\beta_p)]$$

where $\alpha_p$ and $\beta_p$ are the azimuth and elevation of the p-th loudspeaker. The term G(k,n) is a panning gain dependent on the direction of arrival and on the loudspeaker configuration.

In other words the embodiment shown in FIG. 4*c* may provide the audio signals for the loudspeakers corresponding to audio signals obtainable by placing virtual microphones oriented towards the position of the loudspeakers and having point-like sound sources, whose position is determined by the DirAC parameters. The virtual microphones can have pick-up patterns shaped as cardioids, as dipoles, or as any first-order directional pattern.

The reverberated sounds can for example be efficiently used as X and Y in B-format summing. Such embodiments may be applied to horizontal loudspeaker layouts having any number of loudspeakers, without creating a need for more reverberators.

As discussed earlier, mono DirAC decoding has limitations in quality of reverberation, where in embodiments the quality can be improved with virtual microphone DirAC decoding, which takes advantage also of dipole signals in a B-format stream.

The proper creation of B-format signals to reverberate an audio signal for virtual microphone DirAC decoding can be carried out in embodiments. A simple and effective concept which can be used by embodiments is to route different audio channels to different dipole signals, e.g., to X and Y channels. Embodiments may implement this by two reverberators producing incoherent mono audio channels from the same input channel, treating their outputs as B-format dipole audio channels X and Y, respectively, as shown in FIG. 4*c* for the directional components. As the signals are not applied to W, they will be analyzed to be totally diffuse in subsequent DirAC encoding. Also, increased quality for reverberation can be obtained in virtual microphone DirAC decoding, as the dipole channels contain differently reverberated sound. Embodiments may therewith generate a "wider" and more "enveloping" perception of reverberation than with mono DirAC decoding. Embodiments may therefore use a maximum of two reverberators in horizontal loudspeaker layouts, and three for 3-D loudspeaker layouts in the described DirAC-based reverberation.

Embodiments may not be limited to reverberation of signals, but may apply any other audio effects which aim e.g. at a totally diffuse perception of sound. Similar to the above-described embodiments, the reverberated B-format signal can be summed to other synthesized B-format signals in embodiments, such as the ones originating from the N audio sources themselves, thus representing a direct path to the listener.

Figure 4D:
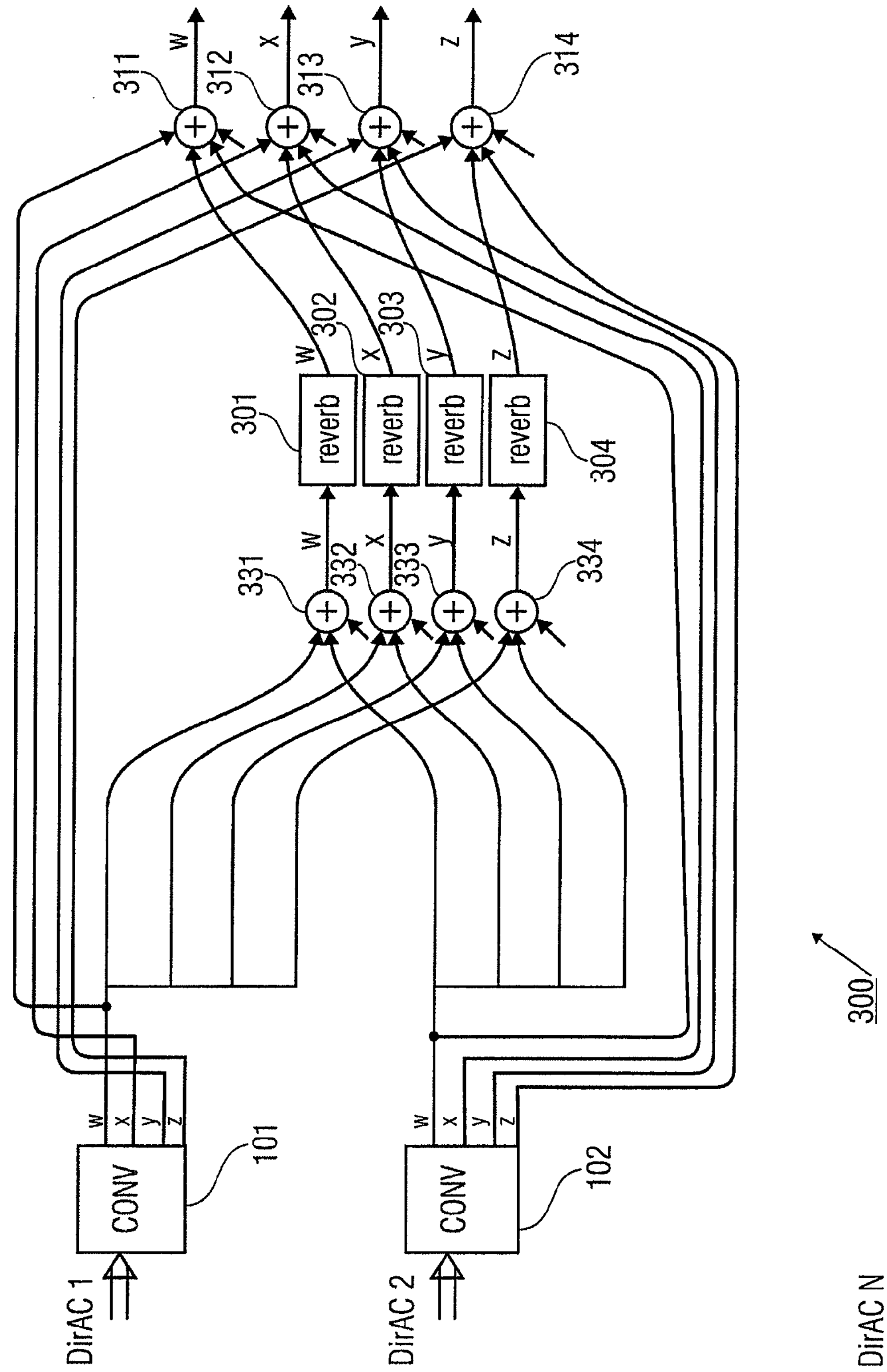

Yet another embodiment is shown in FIG. 4*d*. FIG. 4*d* shows a similar embodiment as FIG. 4*a*, however, no delay or scaling stages 321 or 322 are present, i.e., the individual signals in the branches are only reverberated, in some embodiments only the omnidirectional components W are reverberated. The embodiment depicted in FIG. 4*d* can also be seen as being similar to the embodiment depicted in FIG. 4*a* with the delays and scales or gains prior the reverberators being set to 0 and 1 respectively, however, in this embodiment the reverberators 301, 302, 303 and 304 are not assumed to be arbitrary and independent. In the embodiment depicted in FIG. 4*d* the four audio effect generators are assumed to be dependent on each other having a specific structure.

Each of the audio effect generators or reverberators may be implemented as a tapped delay line as will be detailed subsequently with the help of FIG. 5. The delays and gains or scales can be chosen properly in a way such that each of the taps models one distinct echo whose direction, delay, and power can be set at will.

In such an embodiment, the i-th echo may be characterized by a weighting factor, for example in reference to a DirAC sound $\rho_i$, a delay $\tau_i$ and a direction of arrival $\theta_i$ and $\phi_i$, corresponding to elevation and azimuth respectively.

The parameters of the reverberators may be set as follows $$\tau_W=\tau_X=\tau_Y=\tau_Z=\tau_i$$

$$\gamma_W=\rho_i\text{, for the W reverberator,}$$

$$\gamma_X=\rho_i\cdot\cos(\phi_i)\cdot\cos(\theta_i)\text{, for the } X \text{ reverberator,}$$

$$\gamma_Y=\rho_i\cdot\sin(\phi_i)\cdot\cos(\theta_i)\text{, for the } Y \text{ reveberator,}$$

$$\gamma_Z=\rho_i\cdot\sin(\theta_i)\text{, for the } Z \text{ reverberator.}$$

In some embodiments the physical parameters of each echo may be the drawn from random processes or taken from a room spatial impulse response. The latter could for example be measured or simulated with a ray-tracing tool.

In general embodiments may therewith provide the advantage that the number of audio effect generators is independent of the number of sources.

Figure 5:
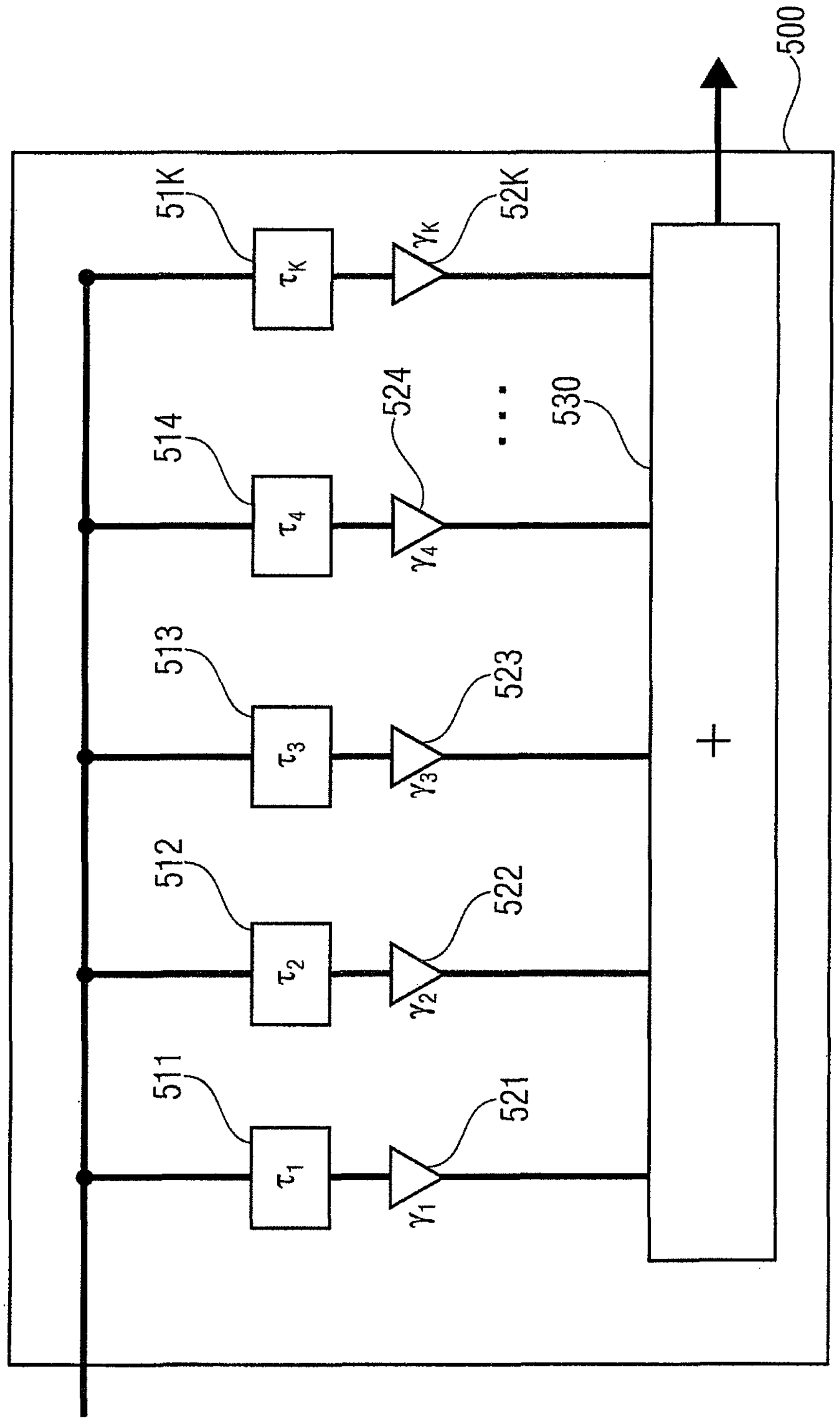
FIG. 5 depicts an embodiment of an audio effect generator.

FIG. 5 depicts an embodiment using a conceptual scheme of a mono audio effect as for example used within an audio effect generator, which is extended within the DirAC context. For instance, a reverberator can be realized according to this scheme. FIG. 5 shows an embodiment of a reverberator 500. FIG. 5 shows in principle an FIR-filter structure (FIR=Finite Impulse Response). Other embodiments may use IIR-filters (IIR=Infinite Impulse Response) as well. An input signal is delayed by the K delay stages labeled by 511 to 51K. The K delayed copies, for which the delays are denoted by $\tau_1$ to $\tau_K$ of the signal, are then amplified by the amplifiers 521 to 52K with amplification factors $\gamma_1$ to $\gamma_K$ before they are summed in the summing stage 530.

Figure 6:
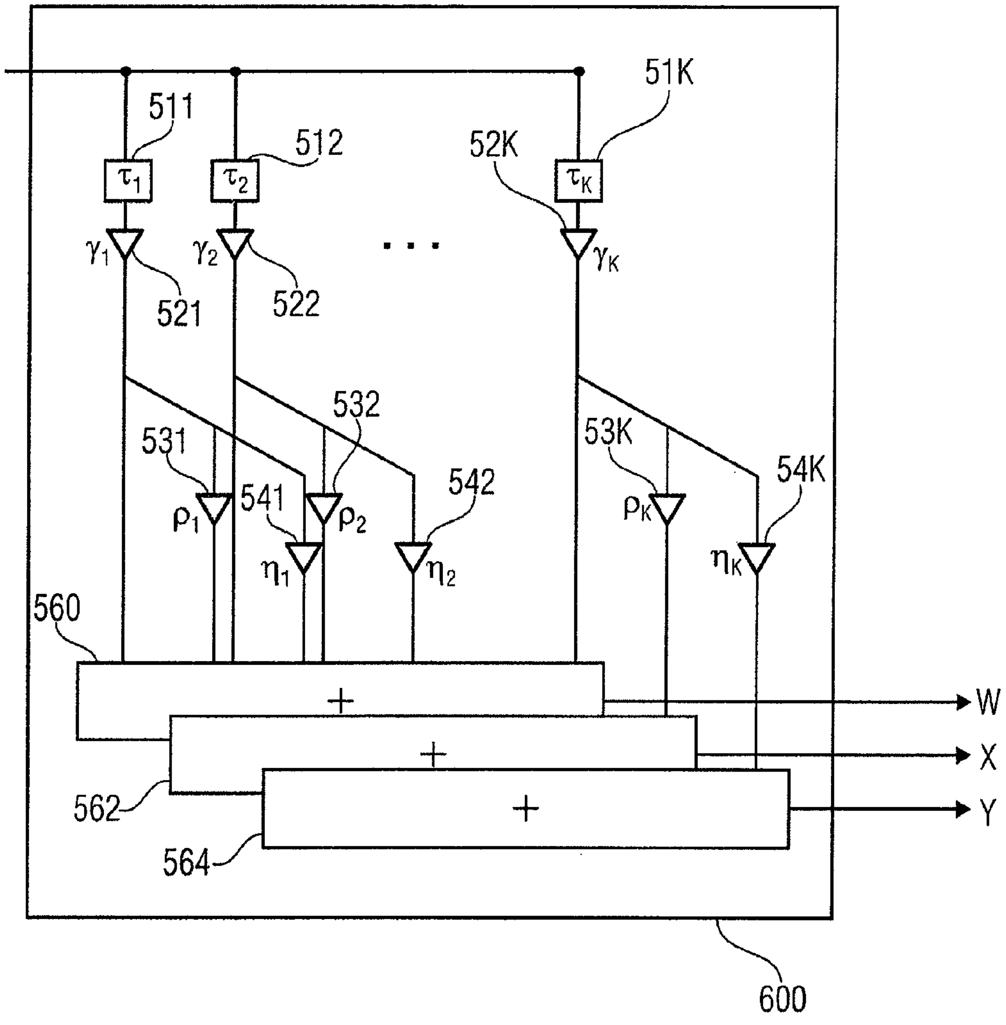
FIG. 6 shows an embodiment of an audio effect generator applying multiple audio effects on directional components.

FIG. 6 shows another embodiment with an extension of the processing chain of FIG. 5 within the DirAC context. The output of the processing block can be a B-format signal. FIG. 6 shows an embodiment where multiple summing stages 560, 562 and 564 are utilized resulting in the three output signals W,X and Y. In order to establish different combinations, the delayed signal copies can be scaled differently before being added in the three different adding stages 560, 562 and 564. This is carried out by the additional amplifiers 531 to 53K and 541 to 54K. In other words, the embodiment 600 shown in FIG. 6 carries out reverberation for different components of a B-format signal based on a mono DirAC stream. Three different reverberated copies of the signal are generated using three different FIR filters being established through different filter coefficients $\rho_1$ to $\rho_K$ and $\eta_1$ to $\eta_K$.

The following embodiment may apply to a reverberator or audio effect which can be modeled as in FIG. 5. An input signal runs through a simple tapped delay line, where multiple copies of it are summed together. The i-th of K branches is delayed and attenuated, by and $\tau_i$ and $\gamma_i$, respectively.

The factors $\gamma$ and $\tau$ can be obtained depending on the desired audio effect. In case of a reverberator, these factors mimic the impulse response of the room which is to be simulated. Anyhow, their determination is not illuminated and they are thus assumed to be given.

An embodiment is depicted in FIG. 6. The scheme in FIG. 5 is extended so that two more layers are obtained. In embodiments, to each branch an angle of arrival $\theta$ can be assigned obtained from a stochastic process. For instance, $\theta$ can be the realization of a uniform distribution in the range $[-\pi,\pi]$. The i-th branch is multiplied with the factors $\eta_i$ and $\rho_i$, which can be defined as $$\eta_i=\sin(\theta_i) \quad (21)$$

$$\rho_i=\cos(\theta_i). \quad (22)$$

Therewith in embodiments, the i-th echo can be perceived as coming from $\theta_i$. The extension to 3D is straight-forward. In this case, one more layer needs to be added, and an elevation angle needs to be considered. Once the B-format signal has been generated, namely W,X,Y, and possibly Z, combining it with other B-format signals can be carried out. Then, it can be sent directly to a virtual microphone DirAC decoder, or after DirAC encoding the mono DirAC stream can be sent to a mono DirAC decoder.

Embodiments may comprise a method for determining a converted spatial audio signal, the converted spatial audio signal having a first directional audio component and a second directional audio component, from an input spatial audio signal, the input spatial audio signal having an input audio representation and an input direction of arrival. The method comprises a step of estimating a wave representation comprising a wave field measure and a wave direction of arrival measure based on the input audio representation and the input direction of arrival. Furthermore, the method comprises a step of processing the wave field measure and the wave direction of arrival measure to obtain the first directional component and the second directional component.

In embodiments a method for determining a converted spatial audio signal may be comprised with a step of obtaining a mono DirAC stream which is to be converted into B-format. Optionally W may be obtained from P, when available. If not, a step of approximating W as a linear combination of the available audio signals can be performed. Subsequently a step of computing the factor β as a frequency time dependent weighting factor inversely proportional to the diffuseness may be carried out, for instance, according to $$\beta(k,n)=\sqrt{1-\Psi(k,n)} \text{ or } \beta(k,n)=\frac{1-\sqrt{1-(1-\Psi(k,n))^2}}{1-\Psi(k,n)}.$$

The method may further comprise a step of computing the signals X,Y and Z from P,β and $e_{DOA}$.

For cases in which Ψ=1, the step of obtaining W from P may be replaced by obtaining W from P with X, Y, and Z being zero, obtaining at least one dipole signal X, Y, or Z from P; W is zero, respectively. Embodiments of the present invention may carry out signal processing in the B-format domain, yielding the advantage that advanced signal processing can be carried out before loudspeaker signals are generated.

Depending on certain implementation requirements of the inventive methods, the inventive methods can be implemented in hardware or software. The implementation can be performed using a digital storage medium, and particularly a flash memory, a disk, a DVD or a CD having electronically readable control signals stored thereon, which cooperate with a programmable computer system such that the inventive methods are performed. Generally, the present invention is, therefore, a computer program code with a program code stored on a machine-readable carrier, the program code being operative for performing the inventive methods when the computer program runs on a computer or processor. In other words, the inventive methods are, therefore, a computer program having a program code for performing at least one of the inventive methods, when the computer program runs on a computer.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. An apparatus adapted to determine a combined converted spatial audio signal, the combined converted spatial audio signal comprising at least a first combined component and a second combined component, from a first and a second input spatial audio signal, the first input spatial audio signal comprising a first input audio representation and a first direction of arrival, the second spatial input signal comprising a second input audio representation and a second direction of arrival, comprising:

- a first processor adapted to determine a first converted signal, the first converted signal comprising a first omnidirectional component and at least one first directional component, from the first input spatial audio signal, the first processor comprising
  - an estimator adapted to estimate a first wave representation, the first wave representation comprising a first wave field measure and a first wave direction of arrival measure, based on the first input audio representation and the first input direction of arrival; and
  - a processor adapted to process the first wave field measure and the first wave direction of arrival measure to acquire the first omnidirectional component and the at least one first directional component;
- wherein the first processor is adapted to provide the first converted signal comprising the first omnidirectional component and the at least one first directional component;
- a second processor adapted to provide a second converted signal based on the second input spatial audio signal, comprising a second omnidirectional component and at least one second directional component, the second processor comprising
  - an other estimator adapted to estimate a second wave representation, the second wave representation comprising a second wave field measure and a second wave direction of arrival measure, based on the second input audio representation and the second input direction of arrival; and
  - an other processor adapted to process the second wave field measure and the second wave direction of arrival measure to acquire the second omnidirectional component and the at least one second directional component;
- wherein the second processor is adapted to provide the second converted signal comprising the second omnidirectional component and at least one second directional component;
- an audio effect generator adapted to render the first omnidirectional component to acquire a first rendered component or to render the first directional component to acquire the first rendered component;
- a first combiner adapted to combine the first rendered component, the first omnidirectional component and the second omnidirectional component, or to combine the first rendered component, the first directional component, and the second directional component to acquire the first combined component; and
- a second combiner adapted to combine the first directional component and the second directional component, or to combine the first omnidirectional component and the second omnidirectional component to acquire the second combined component.

2. The apparatus of claim 1, wherein the estimator or the other estimator is adapted for estimating the first or second wave field measure in terms of a wave field amplitude and a wave field phase.

3. The apparatus of claim 1, wherein the first or second input spatial audio signal further comprises a diffuseness parameter Ψ and wherein the estimator or the other estimator is adapted for estimating the wave field measure further based on the diffuseness parameter Ψ.

4. The apparatus of claim 1, wherein the first or second input direction of arrival refers to a reference point and wherein the estimator or the other estimator is adapted for estimating the first or second wave direction of arrival measure in reference to the reference point, the reference point corresponding to a recording location of the input spatial audio signal.

5. The apparatus of claim 1, wherein the first or the second converted spatial audio signal comprises a first, a second and a third directional component and wherein the processor or the other processor is adapted for further processing the first or second wave field measure and the first or second wave direction of arrival measure to acquire the first, second and third directional components for the first or second converted signal.

6. The apparatus of claim 2, wherein the estimator or the other estimator is adapted for determining the first or second wave field measure based on a fraction β(k,n) of the first or second input audio representation P(k,n), wherein k denotes a time index and n denotes a frequency index.

7. The apparatus of claim 6, wherein the processor or the other processor is adapted to acquire a complex measure of the first directional component X(k,n) and/or the second directional component Y(k,n) and/or the third directional component Z(k,n) and/or the first or second omnidirectional audio component W(k,n) for the first or second converted signal by $$W(k,n)=P(k,n)$$

$$X(k,n)=\sqrt{2}\beta(k,n)\cdot P(k,n)\cdot e_{DOA,x}(k,n)$$

$$Y(k,n)=\sqrt{2}\beta(k,n)\cdot P(k,n)\cdot e_{DOA,y}(k,n)$$

$$Z(k,n)=\sqrt{2}\beta(k,n)\cdot P(k,n)\cdot e_{DOA,z}(k,n)$$

where $e_{DOA,x}(k,n)$ is a component of a unity vector $e_{DOA}(k,n)$ of the first or second input direction of arrival along the x-axis of a Cartesian coordinate system, $e_{DOA,y}(k,n)$ is a component of $e_{DOA}(k,n)$ along the y-axis and $e_{DOA,z}(k,n)$ is a component of $e_{DOA}(k,n)$ along the z-axis.

8. The apparatus of claim 6, wherein the estimator or the other estimator is adapted for estimating the fraction β(k,n) based on the diffuseness parameter Ψ(k,n), according to $$\beta(k,n)=\sqrt{1-\Psi(k,n)}.$$

9. The apparatus of claim 6, wherein the estimator or the other estimator is adapted for estimating the fraction β(k,n) based on Ψ(k,n), according to $$\beta(k,n)=\frac{1-\sqrt{1-(1-\Psi(k,n))^2}}{1-\Psi(k,n)}.$$

10. The apparatus of claim 1, wherein the first or the second input spatial audio signal corresponds to a DirAC coded audio signal and wherein the processor or the other processor is adapted to acquire the first or second omnidirectional component and the at least one first or second directional component in terms of a B-format signal.

11. The apparatus of claim 1, wherein the audio effect generator is adapted for rendering a combination of the first omnidirectional component and the second omnidirectional component, or for rendering a combination of the first directional component and the second directional component to acquire the first rendered component.

12. The apparatus of claim 1 further comprising a first delay and scaling stage for delaying and/or scaling the first omnidirectional and/or the first directional component, and/or a second delay and scaling stage for delaying and/or scaling the second omnidirectional and/or the second directional component.

13. The apparatus of claim 1, comprising a plurality of processors for converting a plurality of input spatial audio signals, the apparatus further comprising a plurality of audio effect generators, wherein the number of audio effect generators is less than the number of processors.

14. The apparatus of claim 1, wherein the audio effect generator is adapted for reverberating the first omnidirectional component or the first directional component to acquire the first rendered component.

15. A method for determining a combined converted spatial audio signal, the combined converted spatial audio signal comprising at least a first combined component and a second combined component, from a first and a second input spatial audio signal, the first input spatial audio signal comprising a first input audio representation and a first direction of arrival, the second spatial input signal comprising a second input audio representation and a second direction of arrival, comprising determining a first converted spatial audio signal, the first converted spatial audio signal comprising a first omnidirectional component and at least one first directional component, from the first input spatial audio signal, by using the sub-steps of estimating a first wave representation, the first wave representation comprising a first wave field measure and a first wave direction of arrival measure, based on the first input audio representation and the first input direction of arrival; and processing the first wave field measure and the first wave direction of arrival measure to acquire the first omnidirectional component and the at least one first directional component;

providing the first converted signal comprising the first omnidirectional component and the at least one first directional component;

determining a second converted spatial audio signal, the second converted spatial audio signal comprising a second omnidirectional component and at least one second directional component, from the second input spatial audio signal, by using the sub-steps of estimating a second wave representation, the second wave representation comprising a second wave field measure and a second wave direction of arrival measure, based on the second input audio representation and the second input direction of arrival; and processing the second wave field measure and the second wave direction of arrival measure to acquire the second omnidirectional component and the at least one second directional component;

providing the second converted signal comprising the second omnidirectional component and the at least one second directional component;

rendering the first omnidirectional component to acquire a first rendered component or rendering the first directional component to acquire the first rendered component;

combining the first rendered component, the first omnidirectional component and the second omnidirectional component, or combining the first rendered component, the first directional component, and the second directional component to acquire the first combined component; and combining the first directional component and the second directional component, or combining the first omnidirectional component and the second omnidirectional component to acquire the second combined component.

16. A non-transitory computer readable storage medium encoded with a computer program when executed by a computer processor causes the processor to perform a method for determining a combined converted spatial audio signal, the combined converted spatial audio signal comprising at least a first combined component and a second combined component, from a first and a second input spatial audio signal, the first input spatial audio signal comprising a first input audio representation and a first direction of arrival, the second spatial input signal comprising a second input audio representation and a second direction of arrival, the method comprising steps of:

determining a first converted spatial audio signal, the first converted spatial audio signal comprising a first omnidirectional component and at least one first directional component, from the first input spatial audio signal, by using the sub-steps of estimating a first wave representation, the first wave representation comprising a first wave field measure and a first wave direction of arrival measure, based on the first input audio representation and the first input direction of arrival; and processing the first wave field measure and the first wave direction of arrival measure to acquire the first omnidirectional component and the at least one first directional component;

providing the first converted signal comprising the first omnidirectional component and the at least one first directional component;

determining a second converted spatial audio signal, the second converted spatial audio signal comprising a second omnidirectional component and at least one second directional component, from the second input spatial audio signal, by using the sub-steps of estimating a second wave representation, the second wave representation comprising a second wave field measure and a second wave direction of arrival measure, based on the second input audio representation and the second input direction of arrival; and processing the second wave field measure and the second wave direction of arrival measure to acquire the second omnidirectional component and the at least one second directional component;

providing the second converted signal comprising the second omnidirectional component and the at least one second directional component;

rendering the first omnidirectional component to acquire a first rendered component or rendering the first directional component to acquire the first rendered component;

combining the first rendered component, the first omnidirectional component and the second omnidirectional component, or combining the first rendered component, the first directional component, and the second directional component to acquire the first combined component; and combining the first directional component and the second directional component, or combining the first omnidirectional component and the second omnidirectional component to acquire the second combined component.

* * * * *